United States Patent
Kim

(10) Patent No.: US 7,433,263 B2
(45) Date of Patent: Oct. 7, 2008

(54) MULTI-PORT SEMICONDUCTOR DEVICE AND METHOD THEREOF

(75) Inventor: Youn-Cheul Kim, Seoul (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 0 days.

(21) Appl. No.: 11/798,709

(22) Filed: May 16, 2007

(65) Prior Publication Data

US 2007/0242554 A1 Oct. 18, 2007

Related U.S. Application Data

(63) Continuation-in-part of application No. 11/375,568, filed on Mar. 15, 2006.

(30) Foreign Application Priority Data

Feb. 28, 2006 (KR) ............ 10-2006-0019214
May 19, 2006 (KR) ............ 10-2006-0045051

(51) Int. Cl.
*G11C 8/00* (2006.01)

(52) U.S. Cl. ............ 365/233.1; 365/230.05; 713/501

(58) Field of Classification Search ......... 365/230.05, 365/233, 233.1; 713/501
See application file for complete search history.

(56) References Cited

U.S. PATENT DOCUMENTS 6,023,770 A * 2/2000 Miyake ............ 713/401
6,256,256 B1 7/2001 Rao
6,914,849 B2 7/2005 Cao et al.

FOREIGN PATENT DOCUMENTS

| JP | 10-275024 | 10/1998 |
| JP | 2002-197864 | 7/2002 |
| KR | 10-2000-0018316 | 4/2000 |
| KR | 10-2002-0050092 | 6/2002 |

* cited by examiner

*Primary Examiner*—Hoai V Ho
(74) *Attorney, Agent, or Firm*—Harness, Dickey & Pierce PLC

(57) ABSTRACT

A multi-port semiconductor device and method thereof are provided. In an example, the multi-port memory device may include a clock generating unit receiving an external clock signal having a given frequency and a given phase, the clock generating unit generating a plurality of local clock signals by adjusting at least one of the given frequency and given phrase of the received external clock signal such that at least one of the plurality of local clock signals have at least one of a different frequency and a different phase as compared to the given frequency and given phrase, respectively, of the received external clock signal.

37 Claims, 22 Drawing Sheets

100

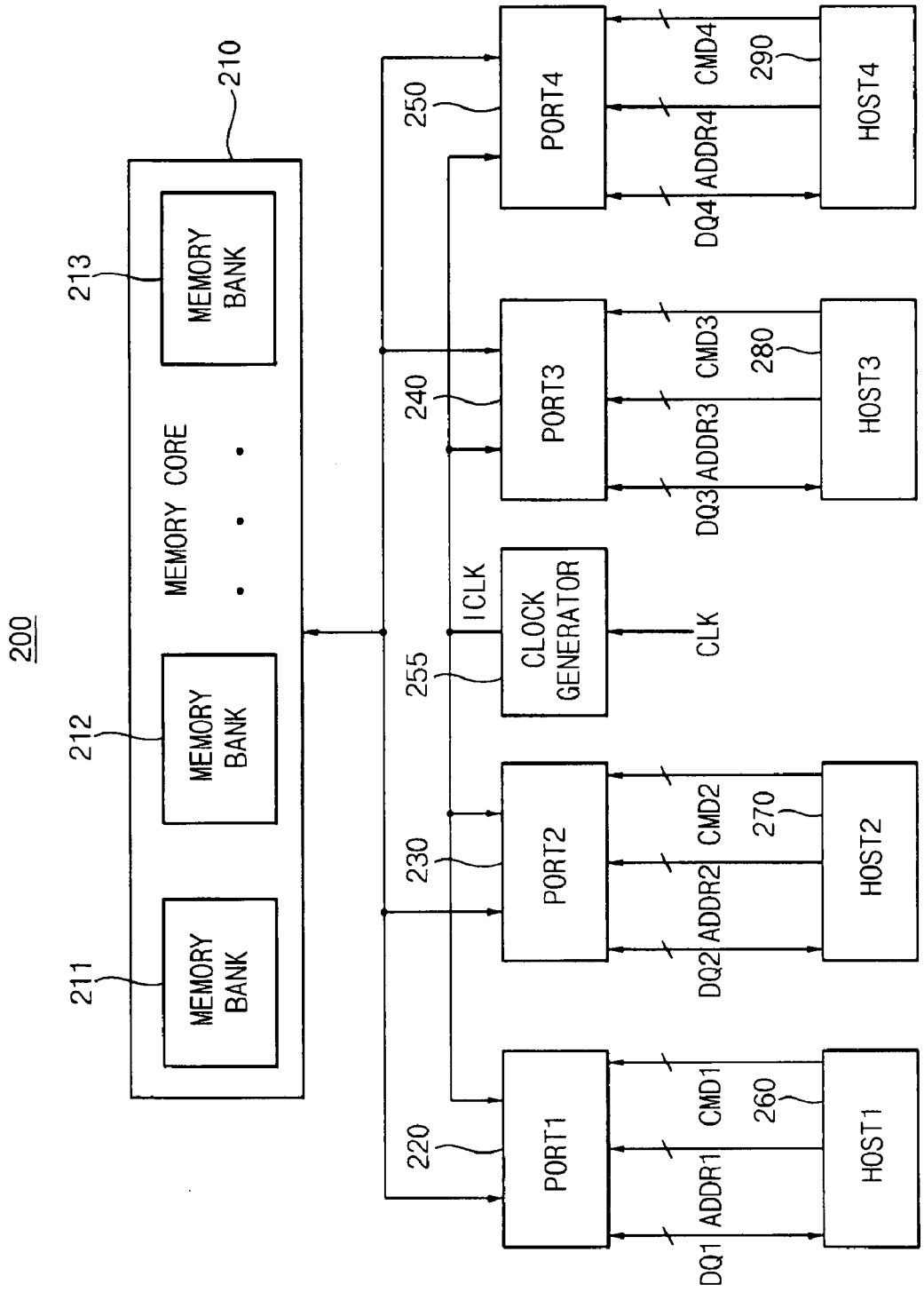

400a

MULTI-PORT SEMICONDUCTOR DEVICE AND METHOD THEREOF

PRIORITY STATEMENT

This application is a continuation-in-part of U.S. patent application Ser. No. 11/375,568, filed on Mar. 15, 2006, now pending, which claims the benefit of priority under 35 USC § 119 to Korean Patent Application No. 2006-19214, filed on Feb. 28, 2006 in the Korean Intellectual Property Office (KIPO), the disclosures of which are incorporated herein in their entirety by reference. This application also claims the benefit of priority under 35 USC § 119 to Korean Patent Application No. 2006-45051, filed on May 19, 2006 in the KIPO, the disclosure of which is incorporated herein in its entirety by reference.

BACKGROUND OF THE INVENTION

1. Field of the Invention

Example embodiments of the present invention relate generally to a multi-port semiconductor device and method thereof.

2. Description of the Related Art

A multi-port memory device may include a plurality of ports that may be used in conjunction with a plurality of applications.

FIG. 1 is a block diagram illustrating a conventional multi-port memory device. Referring to FIG. 1, the multi-port memory device 100 may include a memory core 110 having memory banks 111, 112 and 113 and ports 120, 130, 140 and 150. The port 120 may provide data DQ1 received from an external device to the memory core 110 and/or may output data that stored in the memory core 110 to an external device in response to a first external clock signal CLK1, an address signal ADDR1 and a command signal CMD1. The port 130 may provide data DQ2 received from an external device to the memory core 110 and/or may output data stored in the memory core 110 to an external device in response to a second external clock signal CLK2, an address signal ADDR2 and a command signal CMD2. The port 140 may provide data DQ3 received from an external device to the memory core 110 and/or may output data stored in the memory core 110 to an external device in response to a third external clock signal CLK3, an address signal ADDR3 and a command signal CMD3. The port 150 may provide data DQ4 received from an external device to the memory core 110 and/or may output data stored in the memory core 110 to an external device in response to a fourth external clock signal CLK4, an address signal ADDR4 and a command signal CMD4.

FIG. 2 is a block diagram illustrating another conventional multi-port memory device. Referring to FIG. 2, the multi-port memory device 200 may include a memory core 210 having memory banks 211, 212 and 213, ports 220, 230, 240 and 250 and a clock generator 255. The clock generator 255 may generate an internal clock signal ICLK based on an external clock signal CLK. The port 220 may provide data DQ1 received from an external device to the memory core 210 and/or may output data stored in the memory core 210 to an external device in response to the internal clock signal ICLK, an address signal ADDR1 and a command signal CMD1. The port 230 may provide data DQ2 received from an external device to the memory core 210 and/or may output data stored in the memory core 210 to an external device in response to the internal clock signal ICLK, an address signal ADDR2 and a command signal CMD2. The port 240 may provide data DQ3 received from an external device to the memory core 210 and/or may output data stored in the memory core 210 to an external device in response to the internal clock signal ICLK, an address signal ADDR3 and a command signal CMD3. The port 250 may provide data DQ received from an external device to the memory core 210 and/or may output data stored in the memory core 210 to an external device in response to the internal clock signal ICLK, an address signal ADDR4 and a command signal CMD4.

Referring to FIG. 2, the port (PORT1) 220 may receive an address signal ADDR1 and a command signal CMD1 from the host (HOST1) 260, and may receive and transmit data DQ1 to and from the host (HOST1) 260. The port (PORT2) 230 may receive an address signal ADDR2 and a command signal CMD2 from the host (HOST2) 270, and may receive and transmit data DQ2 to and from the host (HOST2) 270. The port (PORT3) 240 may receive an address signal ADDR3 and a command signal CMD3 from the host (HOST3) 280, and may receive and transmit data DQ3 to and from the host (HOST3) 280. The port (PORT4) 250 may receive an address signal ADDR4 and a command signal CMD4 from the host (HOST4) 290, and may receive and transmit data DQ4 to and from the host (HOST4) 290.

In the conventional multi-port memory device 100 shown in FIG. 1, each of the ports 120, 130, 140 and 150 may operate in response to one of a plurality of clock signals CLK1, CLK2, CLK3 and CLK4 having different frequencies received from external devices. Accordingly, the multi-port memory device 100 of FIG. 1 may include pins on which to receive the clock signals CLK1, CLK2, CLK3 and CLK4, respectively, from the external devices.

In the conventional multi-port memory device 200 shown in FIG. 2, each of the ports 220, 230, 240 and 250 may operate in response to the internal clock signal ICLK (e.g., a single, internally generated clock signal). Accordingly, the multi-port memory device 200 may not be adaptable to hosts operating at different frequencies because the same clock signal is used at each of the ports 220, 230, 240 and 250, whereas the multi-port memory device 100 of FIG. 1 may be dependent upon a plurality of external devices to generate the different frequencies of the clock signals for one or more associated hosts.

SUMMARY OF THE INVENTION

An example embodiment of the present invention is directed to a multi-port semiconductor device, including a clock generating unit receiving an external clock signal having a given frequency and a given phase, the clock generating unit generating a plurality of local clock signals by adjusting at least one of the given frequency and given phrase of the received external clock signal such that at least one of the plurality of local clock signals have at least one of a different frequency and a different phase as compared to the given frequency and given phrase, respectively, of the received external clock signal.

Another example embodiment of the present invention is directed to a method of operating a multi-port memory device, including receiving an external clock signal having a given frequency and a given phase and generating a plurality of local clock signals by adjusting at least one of the given frequency and given phrase of the received external clock signal, at least one of the plurality of local clock signals having at least one of a different frequency and a different phase as compared to the given frequency and given phrase, respectively, of the received external clock signal.

Another example embodiment of the present invention is directed to a multi-port semiconductor device capable of providing clock signals having various frequencies and/or phases for ports.

Another example embodiment of the present invention is directed to a multi-port memory device capable of providing clock signals having various frequencies and/or phases for ports.

BRIEF DESCRIPTION OF THE DRAWINGS

The accompanying drawings are included to provide a further understanding of the invention, and are incorporated in and constitute a part of this specification. The drawings illustrate example embodiments of the present invention and, together with the description, serve to explain principles of the present invention.

FIG. 2 is a block diagram illustrating another conventional multi-port memory device.

DETAILED DESCRIPTION OF EXAMPLE EMBODIMENTS

Figure 1:
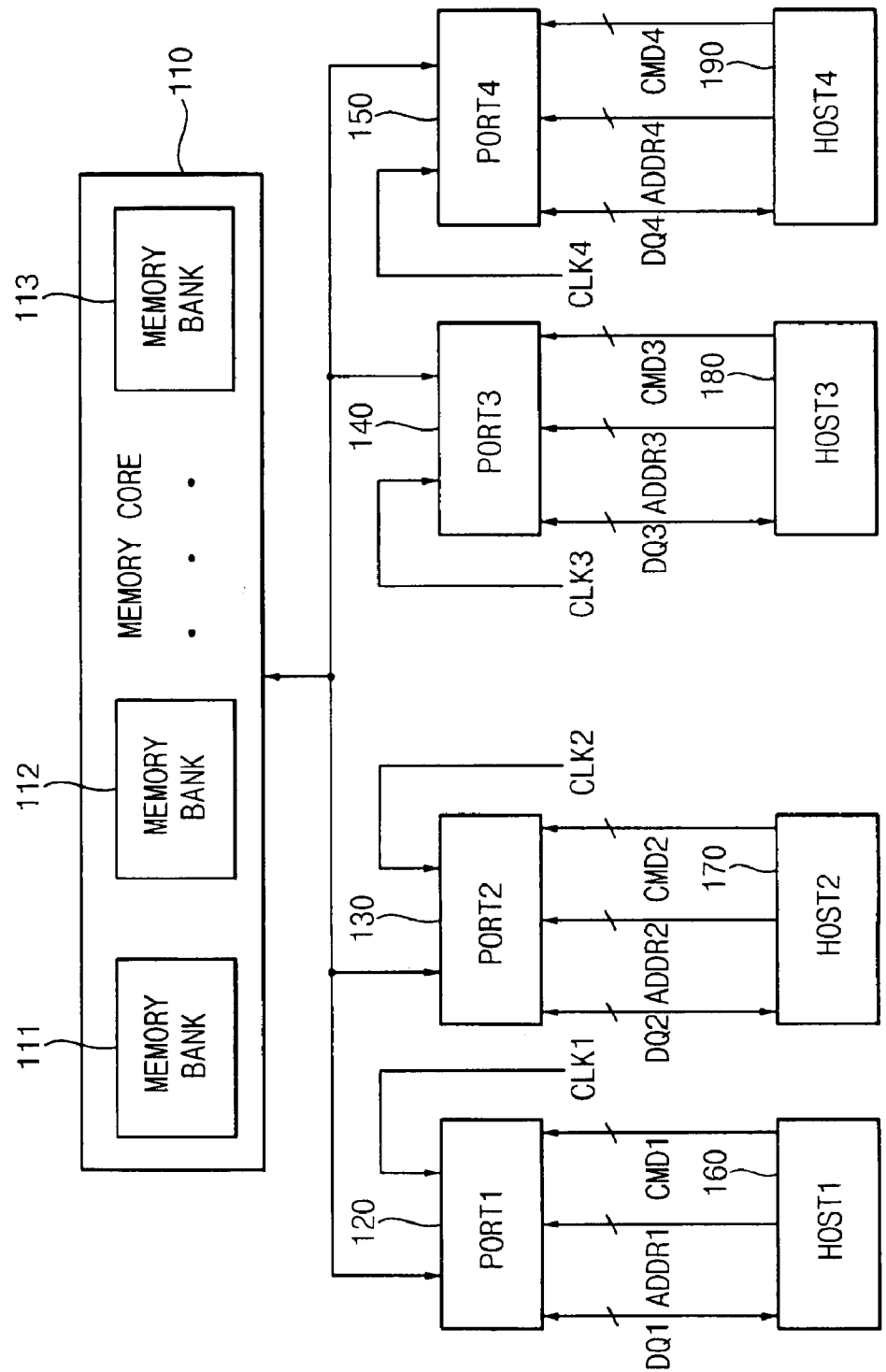
FIG. 1 is a block diagram illustrating a conventional multi-port memory device.

Example embodiments of the present invention now will be described more fully with reference to the accompanying drawings, in which embodiments of the invention are shown. This invention may, however, be embodied in many different forms and should not be construed as limited to the example embodiments set forth herein. Rather, the example embodiments are provided so that this disclosure will be thorough and complete, and will fully convey the scope of the invention to those skilled in the art. Like reference numerals refer to like elements throughout this application.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but need not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In an example embodiment of the present invention, as will be described below in greater detail, each of a plurality of ports may operate in response to a clock signal having a given frequency or a given phase associated with a host coupled to each port. For example, a single, externally received clock signal may be adjusted (e.g., by a buffer at each respective port, at a centralized internal clock generator, etc.) to accommodate an associated host.

Figure 3A:
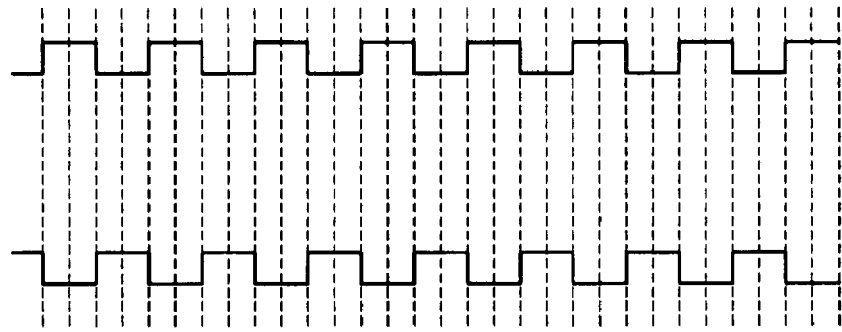
FIG. 3A is a timing diagram illustrating two clock signals having opposite phases according to an example embodiment of the present invention.

FIG. 3A is a timing diagram illustrating two clock signals having opposite phases according to an example embodiment of the present invention.

Figure 3B:
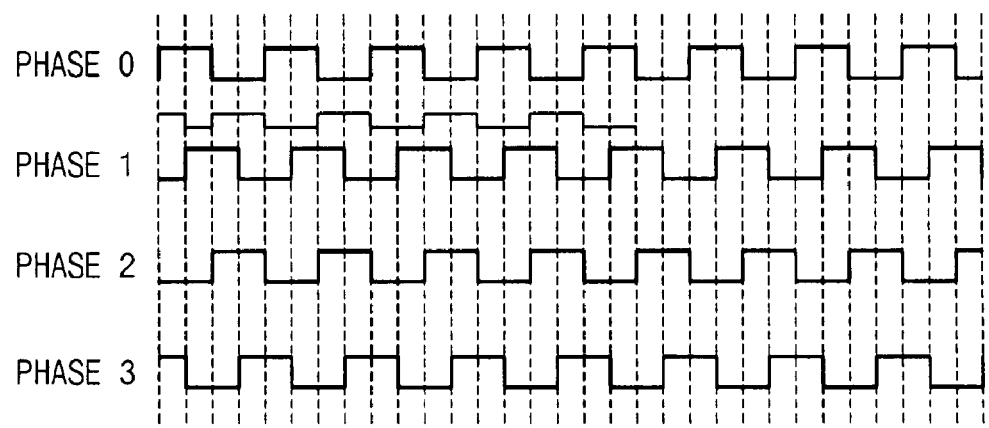
FIG. 3B is a timing diagram illustrating four clock signals having different phases according to another example embodiment of the present invention.

FIG. 3B is a timing diagram illustrating four clock signals PHASE0, PHASE1, PHASE2, and PHASE3 having different phases according to another example embodiment of the present invention.

Figure 4A:
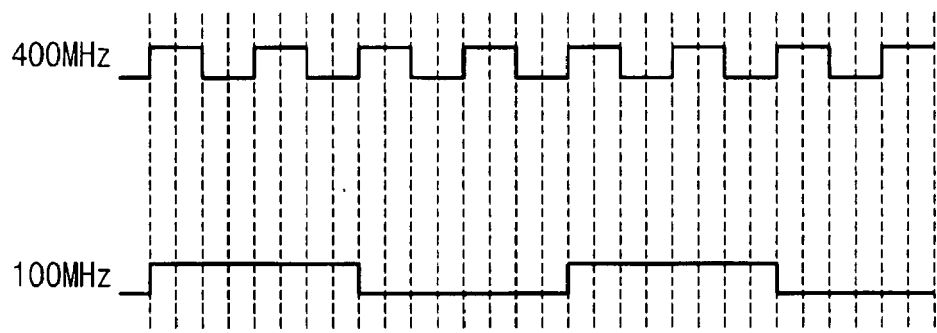
FIG. 4A is a timing diagram illustrating two clock signals having different frequencies according to another example embodiment of the present invention.

FIG. 4A is a timing diagram illustrating two clock signals having frequencies 400 MHz and 100 MHz, respectively, according to another example embodiment of the present invention.

Figure 4B:
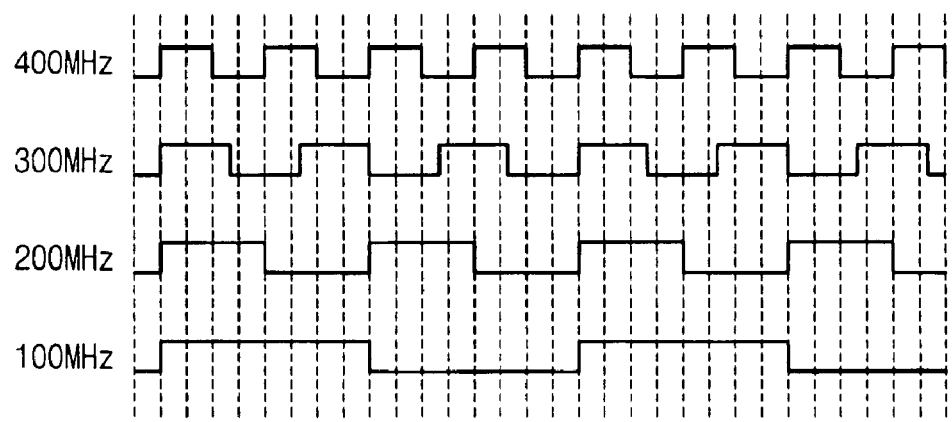
FIG. 4B is a timing diagram illustrating four clock signals having different frequencies according to another example embodiment of the present invention.

FIG. 4B is a timing diagram illustrating four clock signals having frequencies 400 MHz, 300 MHz, 200 MHz, and 100 MHz, respectively according to another example embodiment of the present invention.

Figure 5:
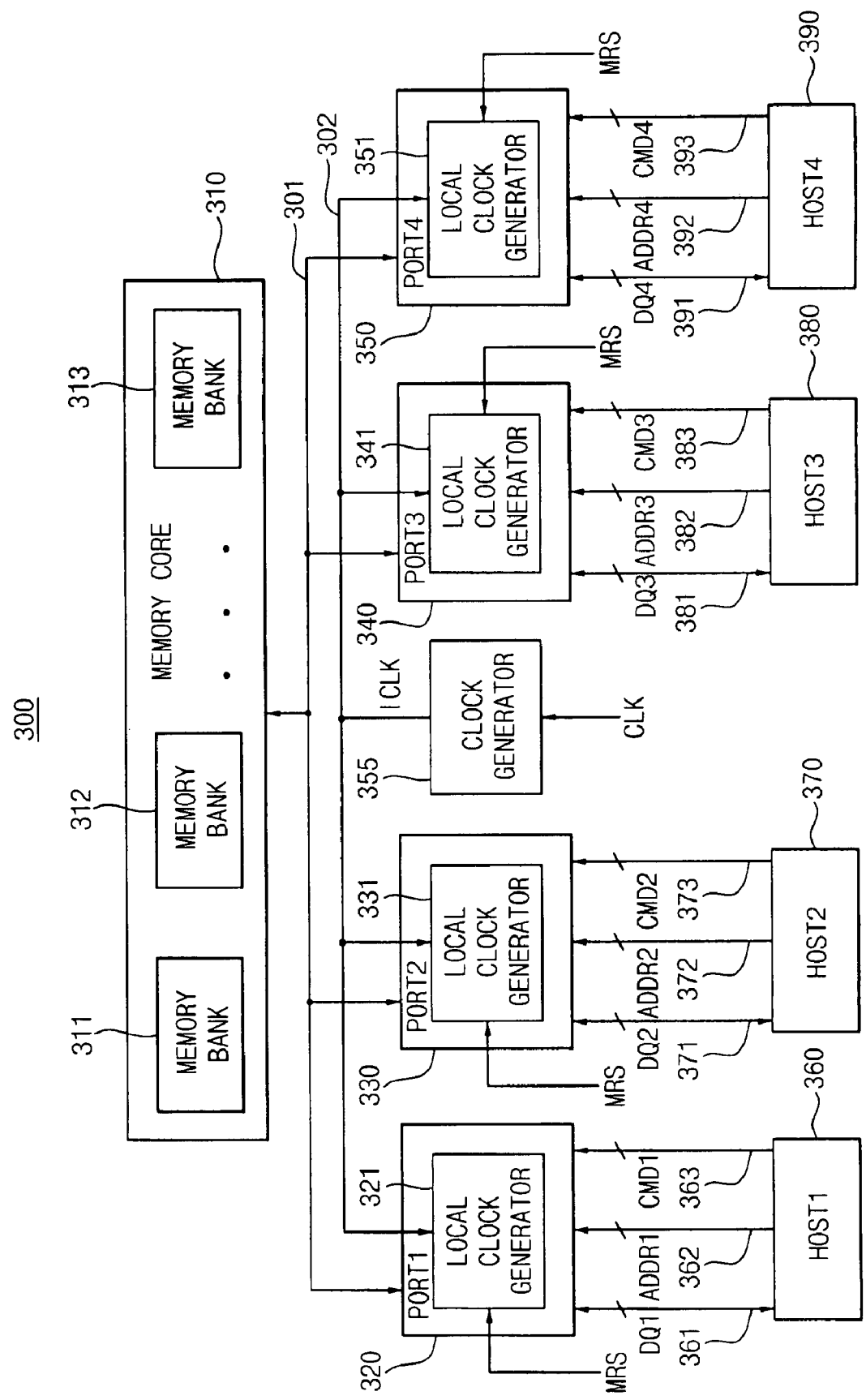
FIG. 5 is a block diagram illustrating a multi-port memory device according to an example embodiment of the present invention.

FIG. 5 is a block diagram illustrating a multi-port memory device 300 according to an example embodiment of the present invention.

In the example embodiment of FIG. 5, the multi-port memory device 300 may include a memory core 310 having memory banks 311, 312 and 313, ports 320, 330, 340 and 350 and a clock generator 355. Further, the multi-port memory device 300 may include hosts 360, 370, 380, and 390 that are coupled to each of the ports 320, 330, 340, and 350, respectively. Each of the ports 320, 330, 340 and 350 may include a local clock generator 321, 331, 341 and 351, respectively. The clock generator 355 may generate an internal clock signal ICLK based on an external clock signal CLK. The internal clock signal ICLK provided to each of a plurality of local clock generators 321, 331, 341 and 351 that may be included in the ports 320, 330, 340 and 350, respectively.

In the example embodiment of FIG. 5, while the local clock generators 321, 331, 341 and 351 are illustrated as being positioned "inside" of the ports 320, 330, 340 and 350, the local clock generators 321, 331, 341 and 351 may alternatively be positioned "outside" of the ports 320, 330, 340 and 350, respectively, in another example embodiment of the present invention.

In the example embodiment of FIG. 5, the first local clock generator 321 may generate a first local clock signal having a first frequency and a first bandwidth based on the internal clock signal ICLK. The second local clock generator 331 may generate a second local clock signal having a second frequency and a second bandwidth based on the internal clock signal ICLK. The third local clock generator 341 may generate a third local clock signal having a third frequency and a third bandwidth based on the internal clock signal ICLK. The fourth local clock generator 351 may generate a fourth local clock signal having a fourth frequency and a fourth bandwidth based on the internal clock signal ICLK.

In the example embodiment of FIG. 5, frequencies of the respective local clock signals that are generated by the local clock generators 321, 331, 341 and 351 may be established or set based on a mode register set (MRS) signal.

In the example embodiment of FIG. 5, the first port 320 may provide data DQ1 to the memory core 310 and/or may output data stored in the memory core 310 to an external device in response to the first local clock signal, an address signal ADDR1 and a command signal CMD1. The second port 330 may provide data DQ2 to the memory core 310 and/or may output data stored in the memory core 310 to an external device in response to the second local clock signal, an address signal ADDR2 and a command signal CMD2. The third port 340 may provide data DQ3 to the memory core 310 and/or may output data stored in the memory core 310 to an external device in response to the third local clock signal, an address signal ADDR3 and a command signal CMD3. The fourth port 350 may provide data DQ4 to the memory core 310 and/or may output data stored in the memory core 310 to an external device in response to the fourth local clock signal, an address signal ADDR4 and a command signal CMD4.

In the example embodiment of FIG. 5, the first port (PORT1) 320 may receive an address ADDR1 and a command CMD1 through buses 362 and 363 from the first host (HOST1) 360, and may receive and transmit data DQ1 through a bus 361. The second port (PORT2) 330 may receive an address ADDR2 and a command CMD2 through buses 372 and 373 from the second host (HOST2) 370, and may receive and transmit data DQ2 through a bus 371. The third port (PORT3) 340 may receive an address ADDR3 and a command CMD3 through buses 382 and 383 from the third host (HOST3) 380, and may receive and transmit data DQ3 through a bus 381. The fourth port (PORT4) 350 may receive an address ADDR4 and a command CMD4 through buses 392 and 393 from the fourth host (HOST4) 390, and may receive and transmit data DQ4 through a bus 391.

In the example embodiment of FIG. 5, each of the ports 320, 330, 340 and 350 may receive and transmit an address signal, a command signal and data to and from respective hosts in a parallel transmission mode.

In the example embodiment of FIG. 5, each of the DATA DQ1, DQ2, DQ3, and DQ4 may be transmitted through one of buses 361, 371, 381, and/or 391. In an example, input data and output data may be received/transmitted via different buses.

Hereinafter, example operation of the multi-port memory device 300 of FIG. 5 will be described.

In example operation of the multi-port memory device 300 of FIG. 5, the internal clock signal ICLK generated by the clock generator 355 may have a given frequency and a given phase. Further, the internal clock signal ICLK generated by the clock generator 355 may have a given bandwidth. The internal clock signal ICLK may be converted into "local" clock signals (e.g., local to each respective port) having frequencies and bandwidths which may be configured for the ports 320, 330, 340 and 350 by the local clock generators 321, 331, 341 and 351, respectively.

In example operation of the multi-port memory device 300 of FIG. 5, the multi-port memory device 300 may receive the external clock signal CLK through a given input/output (I/O) pin (not shown), and may generate the internal clock signal ICLK. Further, the multi-port memory device 300 of FIG. 5 may include the local clock generators 321, 331, 341 and 351 in the ports 320, 330, 340 and 350, respectively, to generate the corresponding local clock signals. Accordingly, the multi-port memory device 300 of FIG. 5 may generate clock signals having frequencies and bandwidths suitable or configured for the ports 320, 330, 340 and 350, respectively, without increasing the number of pins. In an example, frequencies of the local clock signals generated by the local clock generators 321, 331, 341 and 351 may be set based on a mode register set (MRS) signal. In an example, the MRS signal may be generated using one or more command signals in a semiconductor memory device.

Figure 6:
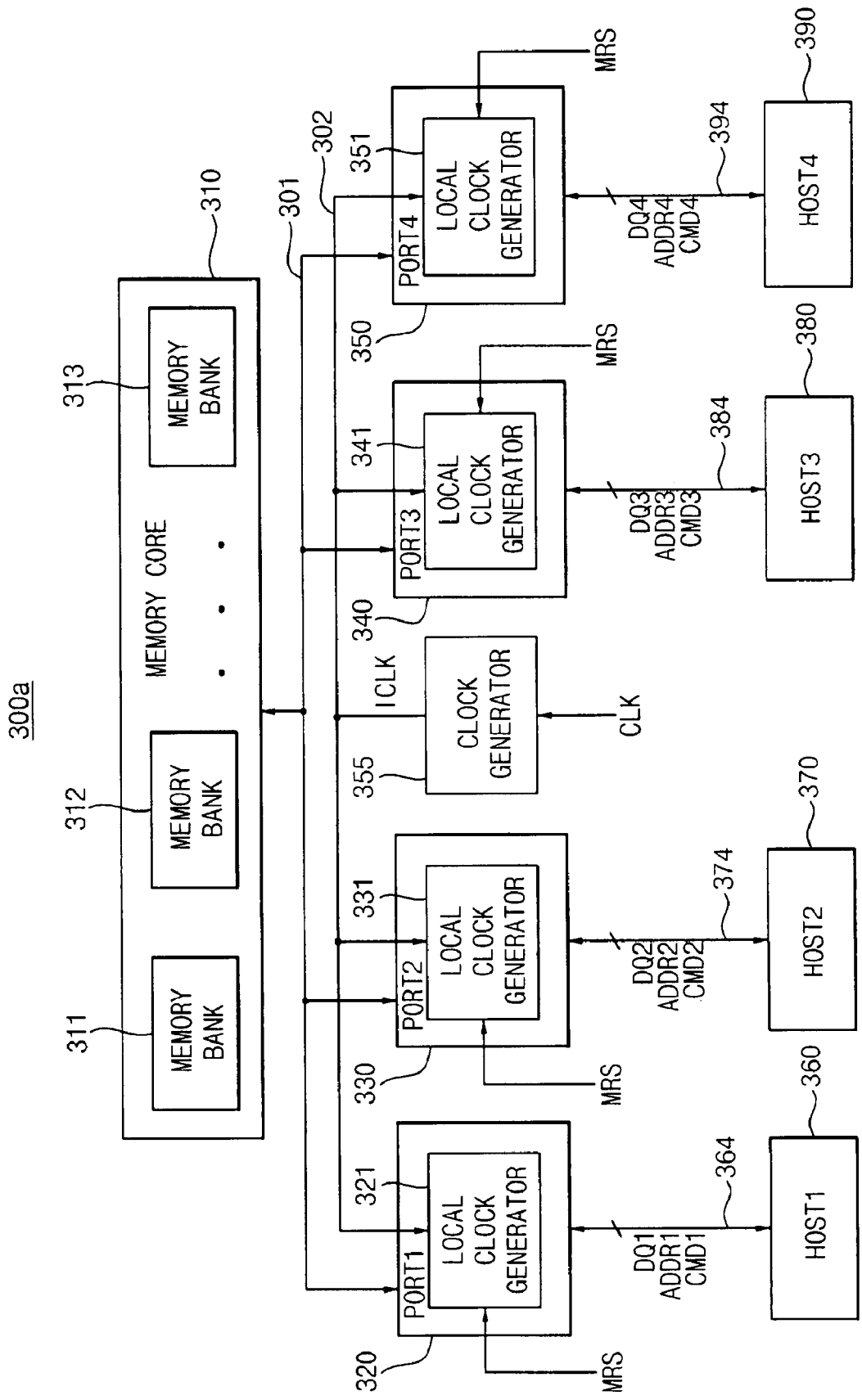
FIG. 6 is a block diagram illustrating a multi-port memory device according to another example embodiment of the present invention.

FIG. 6 is a block diagram illustrating a multi-port memory device 300a according to another example embodiment of the present invention.

In the example embodiment of FIG. 6, the multi-port memory device 300a of FIG. 6 may have a configuration similar to that of the multi-port memory device 300 shown in FIG. 5. However, the multi-port memory device 300a of FIG. 6 may further receive and transmit an address signal, a command signal and data to and from respective hosts in a serial transmission mode, whereas the multi-port memory device 300 of FIG. 5 may operate in accordance with a parallel transmission mode.

In the example embodiment of FIG. 6, the first port (PORT1) 320 may receive an address ADDR1, a command CMD1, and data DQ1 through a bus 364 from the first host (HOST1) 360. The second port (PORT2) 330 may receive an address ADDR2, a command CMD2, and data DQ2 through a bus 374 from the second host (HOST2) 370. The third port (PORT3) 340 may receive an address ADDR3, a command CMD3, and data DQ3 through a bus 384 from the third host (HOST3) 380. The fourth port (PORT4) 350 may receive an address ADDR4, a command CMD4, and data DQ4 through a bus 394 from the fourth host (HOST4) 390.

In the example embodiment of FIG. 6, while the local clock generators 321, 331, 341 and 351 are illustrated as being positioned "inside" of the ports 320, 330, 340 and 350, the local clock generators 321, 331, 341 and 351 may alternatively be positioned "outside" of the ports 320, 330, 340 and 350, respectively, in other example embodiments of the present invention.

In the example embodiment of FIG. 6, the multi-port memory device 300a may operate similarly to that multi-port memory device 300 shown in FIG. 5, and thus a further description thereof has been omitted for the sake of brevity.

Figure 7:
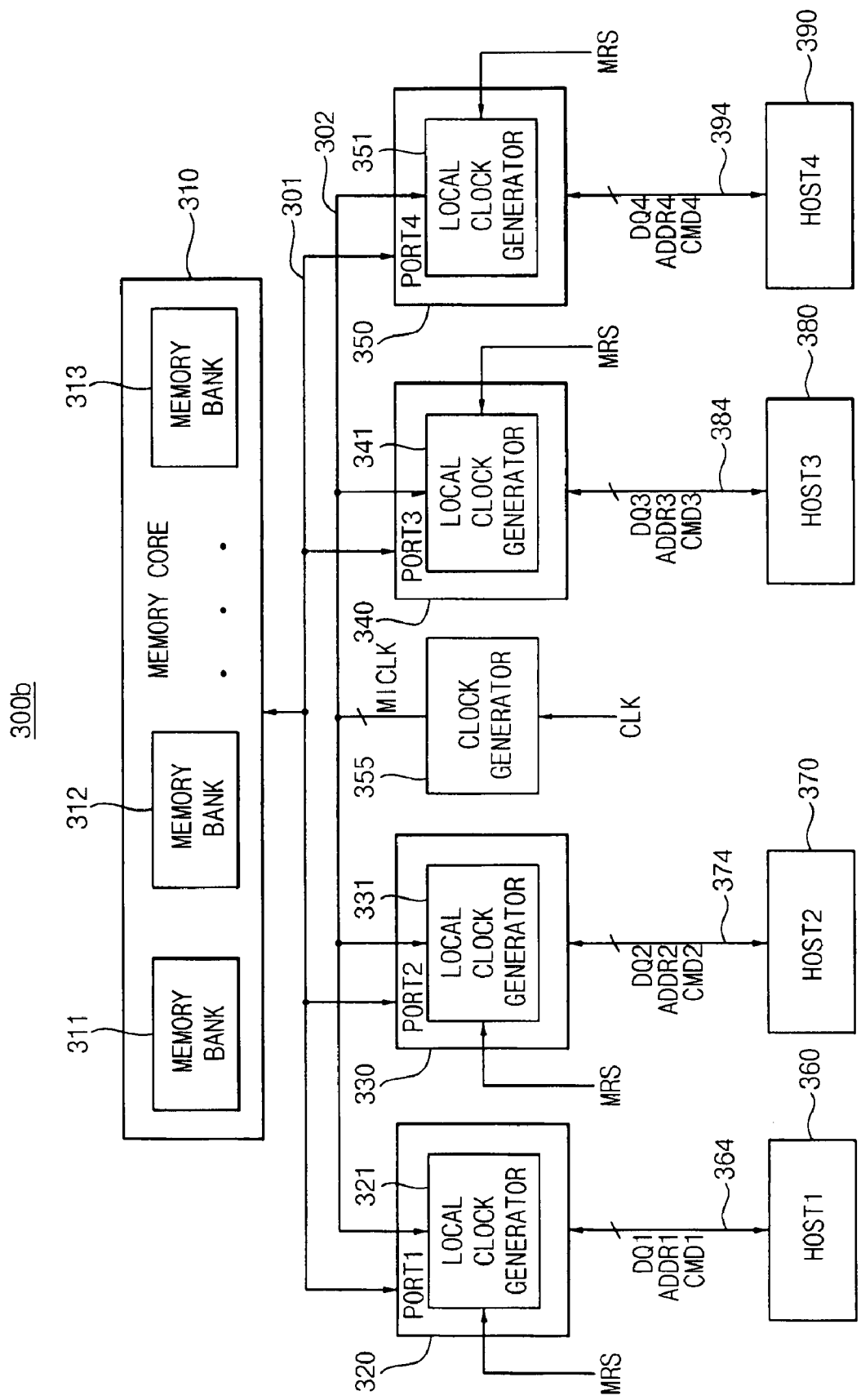
FIG. 7 is a block diagram illustrating a multi-port memory device according to another example embodiment of the present invention.

FIG. 7 is a block diagram illustrating a multi-port memory device 300b according to another example embodiment of the present invention.

In the example embodiment of FIG. 7, the multi-port memory device 300b shown in FIG. 7 may have a configuration similar to that of the multi-port memory device 300a of FIG. 6. However, the internal clock signal MICLK generated by the clock generator 355 in FIG. 7 may be configured to have multiple phases, whereas the internal clock signal ICLK generated by the clock generator 355 in FIG. 6 may be configured to have a single, given phase.

In the example embodiment of FIG. 7, the internal clock signal MICLK generated by the clock generator 355 may include two clock signals having opposite phases from each other as illustrated in the example embodiment of FIG. 3A. In an alternative example the internal clock signal MICLK generated by the clock generator 355 may include four clock signals having different phases from each other as illustrated in the example embodiment of FIG. 3B.

In the example embodiment of FIG. 7, while the local clock generators 321, 331, 341 and 351 are illustrated as being positioned "inside" of the ports 320, 330, 340 and 350, the local clock generators 321, 331, 341 and 351 may alternatively be positioned "outside" of the ports 320, 330, 340 and 350, respectively, in other example embodiments of the present invention.

In the example embodiment of FIG. 7, the multi-port memory device 300b may operate similarly to that of the multi-port memory device 300 of FIG. 5, and as such a further description thereof has been omitted for the sake of brevity.

Figure 8:
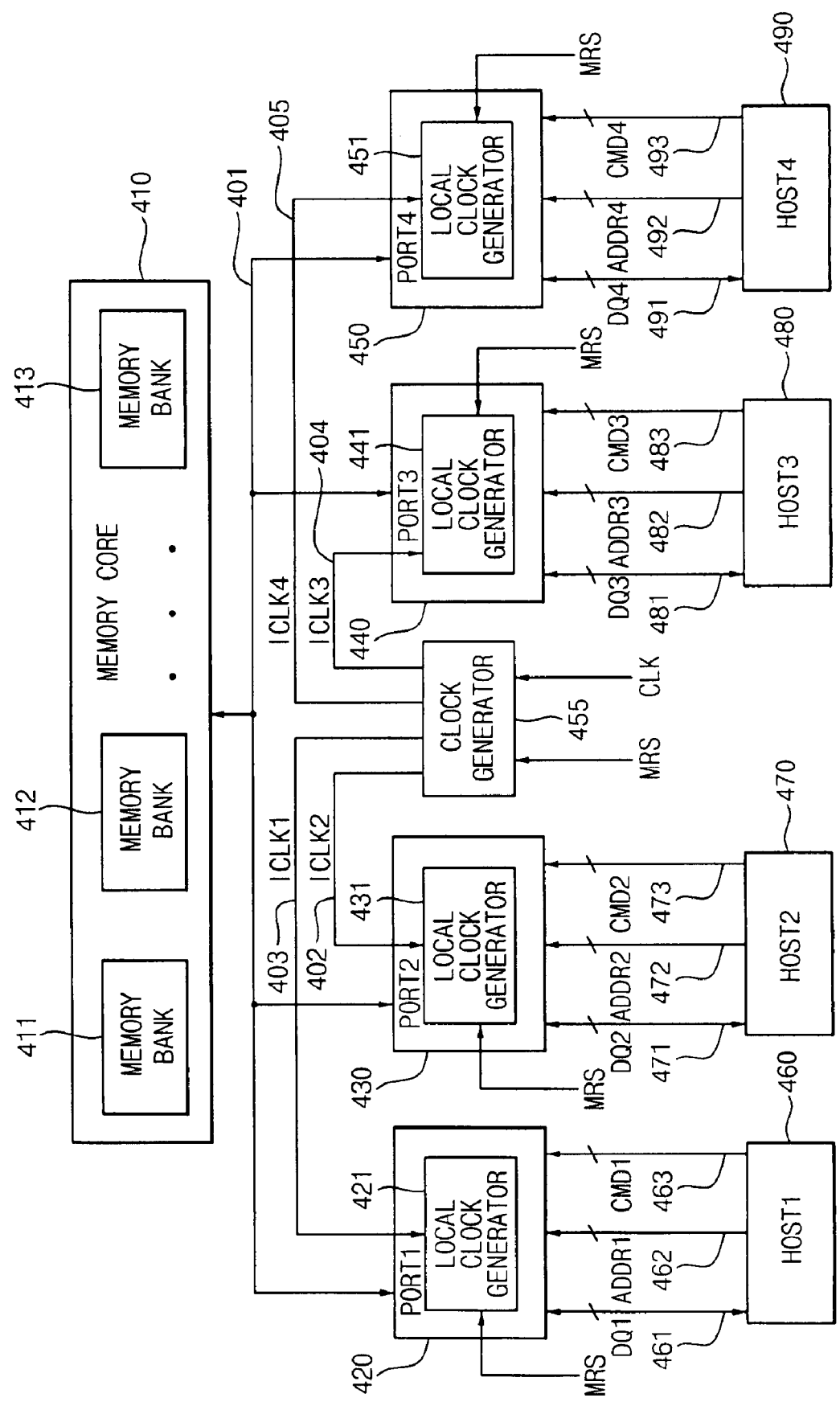
FIG. 8 is a block diagram illustrating a multi-port memory device according to another example embodiment of the present invention.

FIG. 8 is a block diagram illustrating a multi-port memory device 400 according to another example embodiment of the present invention.

In the example embodiment of FIG. 8, the multi-port memory device 400 may include a memory core 410 having memory banks 411, 412 and 413, ports 420, 430, 440 and 450 and a clock generator 455. Further, the multi-port memory device 400 may include hosts 460, 470, 480, and 490 that are coupled to each of the ports 420, 430, 440, and 450, respectively. Each of the ports 420, 430, 440 and 450 may include a local clock generator 421, 431, 441 and 451, respectively. The clock generator 455 may generate internal clock signals ICLK1, ICLK2, ICLK3, and ICLK4 based on an external clock signal CLK. In an example, frequencies of the internal clock signals ICLK1, ICLK2, ICLK3, and ICLK4 may be established or set in response to a MRS signal.

In the example embodiment of FIG. 8, while the local clock generators 421, 431, 441 and 451 are illustrated as being positioned "inside" of the ports 420, 430, 440 and 450, the local clock generators 421, 431, 441 and 451 may alternatively be positioned "outside" of the ports 420, 430, 440 and 450, respectively, in other example embodiments of the present invention.

In the example embodiment of FIG. 8, the first internal clock signal ICLK1 may be provided to the first local clock generator 421 in the first port 420 through a bus 403. The second internal clock signal ICLK2 may be provided to the second local clock generator 431 in the second port 430 through a bus 402. The third internal clock signal ICLK3 may be provided to the third local clock generator 441 in the third port 440 through a bus 404. The fourth internal clock signal ICLK4 may be provided to the fourth local clock generator 451 in the fourth port 450 through a bus 405.

In the example embodiment of FIG. 8, the first local clock generator 421 may generate a first local clock signal having a first frequency and a first bandwidth based on the internal clock signal ICLK1. The second local clock generator 431 may generate a second local clock signal having a second frequency and a second bandwidth based on the internal clock signal ICLK2. The third local clock generator 441 may generate a third local clock signal having a third frequency and a third bandwidth based on the internal clock signal ICLK3. The fourth local clock generator 451 may generate a fourth local clock signal having a fourth frequency and a fourth bandwidth based on the internal clock signal ICLK4.

In the example embodiment of FIG. 8, frequencies of the respective local clock signals that are generated by the local clock generators 421, 431, 441 and 451 may be set, for example, based on a MRS signal.

In the example embodiment of FIG. 8, the first port 420 may provide data DQ1 to the memory core 410 and/or may output data stored in the memory core 410 to an external device in response to the first local clock signal, an address signal ADDR1 and a command signal CMD1. The second port 430 may provide data DQ2 to the memory core 410 and/or may output data stored in the memory core 410 to an external device in response to the second local clock signal, an address signal ADDR2 and a command signal CMD2. The third port 440 may provide data DQ3 to the memory core 410 and/or may output data stored in the memory core 410 to an external device in response to the third local clock signal, an address signal ADDR3 and a command signal CMD3. The fourth port 450 may provide data DQ4 to the memory core 410 and/or may output data stored in the memory core 410 to an external device in response to the fourth local clock signal, an address signal ADDR4 and a command signal CMD4.

In the example embodiment of FIG. 8, the first port (PORT1) 420 may receive an address ADDR1 and a command CMD1 through buses 462 and 463 from the first host (HOST1) 460, and may receive and transmit data DQ1 through a bus 461. The second port (PORT2) 430 may receive an address ADDR2 and a command CMD2 through buses 472 and 473 from the second host (HOST2) 470, and may receive and transmit data DQ2 through a bus 471. The third port (PORT3) 440 may receive an address ADDR3 and a command CMD3 through buses 482 and 483 from the third host (HOST3) 480, and may receive and transmit data DQ3 through a bus 481. The fourth port (PORT4) 450 may receive an address ADDR4 and a command CMD4 through buses 492 and 493 from the fourth host (HOST4) 490, and may receive and transmit data DQ4 through a bus 491.

In the example embodiment of FIG. 8, in an example, the internal clock signals ICLK1, ICLK2, ICLK3, and ICLK4 generated by the clock generator 355 may correspond to two clock signals having different frequencies from each other as illustrated in the example embodiment of FIG. 4A. In an alternative example, the internal clock signals ICLK1, ICLK2, ICLK3, and ICLK4 may correspond to four clock signals having different frequencies from each other as illustrated in the example embodiment of FIG. 4B.

In the example embodiment of FIG. 8, each of the ports 420, 430, 440 and 450 may receive and transmit an address signal, a command signal and data to and from respective hosts in a parallel transmission mode.

In the example embodiment of FIG. 8, each of the DATA DQ1, DQ2, DQ3, and DQ4 may be transmitted through buses 461, 471, 481, and 491, respectively. However, input data and output data may be transmitted through different buses.

Hereinafter, example operation of the multi-port memory device 400 of FIG. 8 according will be described in greater detail.

In example operation of the multi-port memory device 400 of FIG. 8, the internal clock signals ICLK1, ICLK2, ICLK3, and ICLK4 generated by the clock generator 455 may each have different frequencies. Further, the internal clock signals ICLK1, ICLK2, ICLK3, and ICLK4 generated by the clock generator 455 may each have different bandwidths. Each of the internal clock signals ICLK1, ICLK2, ICLK3, and ICLK4 may have the same phase.

In example operation of the multi-port memory device 400 of FIG. 8, frequencies of the respective internal clock signals ICLK1, ICLK2, ICLK3, and ICLK4 generated by the clock generator 455 may be set based on a MRS signal. The internal clock signals ICLK1, ICLK2, ICLK3, and ICLK4 may be converted into local clock signals having frequencies and bandwidths more suitable for the ports 420, 430, 440 and 450 by the local clock generators 421, 431, 441 and 451, respectively. Frequencies of the respective local clock signals generated by the respective local clock generators 421, 431, 441 and 451 may be set based on a MRS signal.

In example operation of the multi-port memory device 400 of FIG. 8. the multi-port memory device 400 may receive the external clock signal CLK through a given pin (not shown) and may generate the internal clock signals ICLK1, ICLK2, ICLK3, and ICLK4. Further, the multi-port memory device 400 may include the local clock generators 421, 431, 441 and 451 in the port 420, 430, 440 and 450, respectively, to generate local clock signals having frequencies and bandwidths more suitable for the ports 420, 430, 440 and 450. Accordingly, the multi-port memory device 400 may generate clock signals having frequencies and bandwidths "suitable" for or compatible with each of the respective ports 420, 430, 440 and 450 without necessarily increasing the number of pins (e.g., without requiring additional pins to receive clock signals at different respective frequencies for compatibility).

Figure 9:
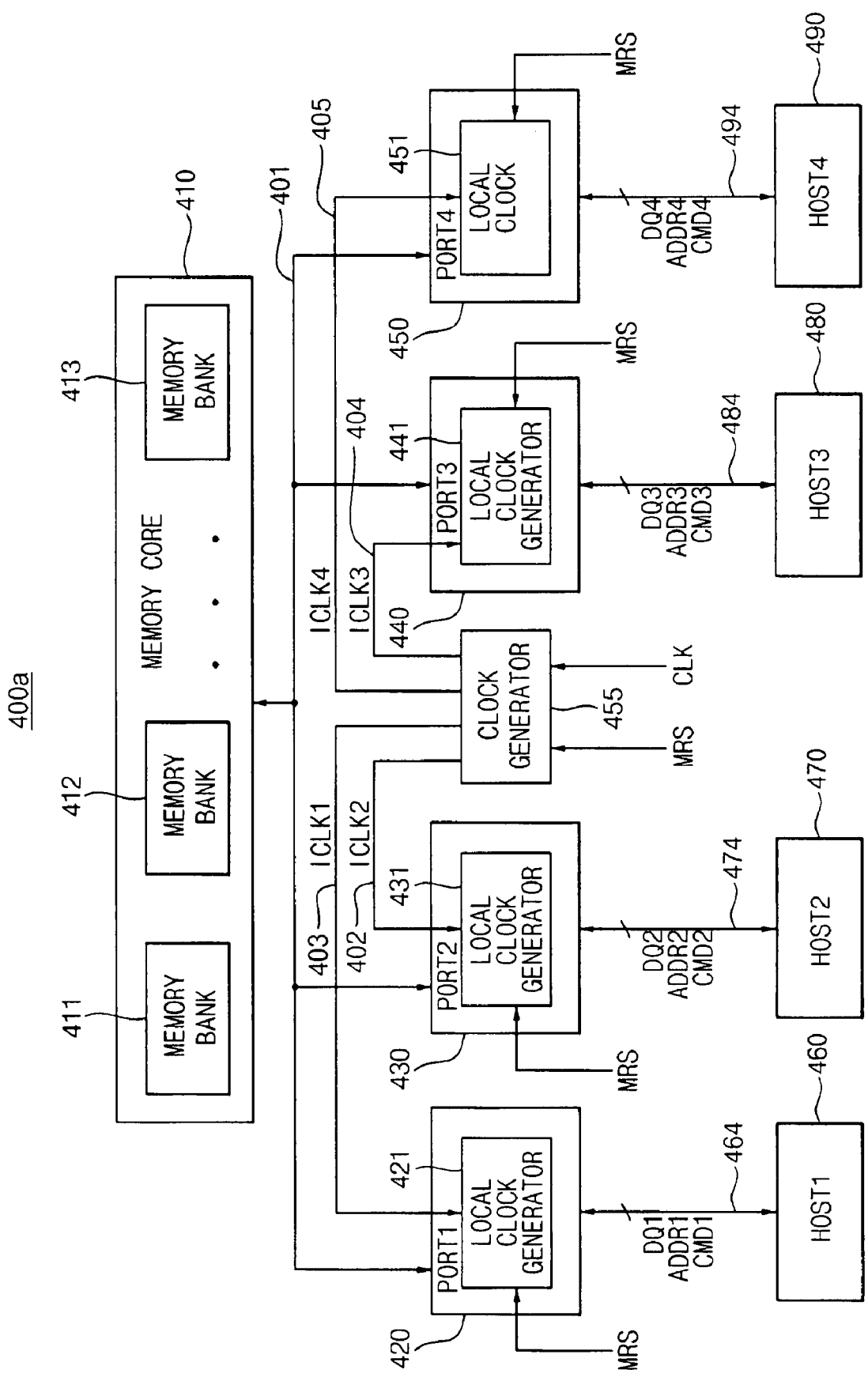
FIG. 9 is a block diagram illustrating a multi-port memory device according to another example embodiment of the present invention.

FIG. 9 is a block diagram illustrating a multi-port memory device 400a according to another example embodiment of the present invention.

In the example embodiment of FIG. 9, the multi-port memory device 400a may have a configuration similar to that of the multi-port memory device 400 shown in FIG. 8. However, the multi-port memory device 400a may receive and transmit an address signal, a command signal and data to and from respective hosts in a serial transmission mode, whereas the multi-port memory device 400 may operate in accordance with a parallel transmission mode.

In the example embodiment of FIG. 9, the first port (PORT1) 420 may receive an address ADDR1, a command CMD1, and data DQ1 through a bus 464 from the first host (HOST1) 460. The second port (PORT2) 430 may receive an address ADDR2, a command CMD2, and data DQ2 through a bus 474 from the second host (HOST2) 470. The third port (PORT3) 440 may receive an address ADDR3, a command CMD3, and data DQ3 through a bus 484 from the third host (HOST3) 480. The fourth port (PORT4) 450 may receive an address ADDR4, a command CMD4, and data DQ4 through a bus 494 from the fourth host (HOST4) 490.

In the example embodiment of FIG. 9, while the local clock generators 421, 431, 441 and 451 are illustrated as being positioned "inside" of the ports 420, 430, 440 and 450, the local clock generators 421, 431, 441 and 451 may alternatively be positioned "outside" of the ports 420, 430, 440 and 450, respectively, in other example embodiments of the present invention.

In the example embodiment of FIG. 9, the multi-port memory device 400a may operate similarly to the multi-port memory device 400 shown in FIG. 8, and thus a further description thereof has been omitted for the sake of brevity.

Figure 10:
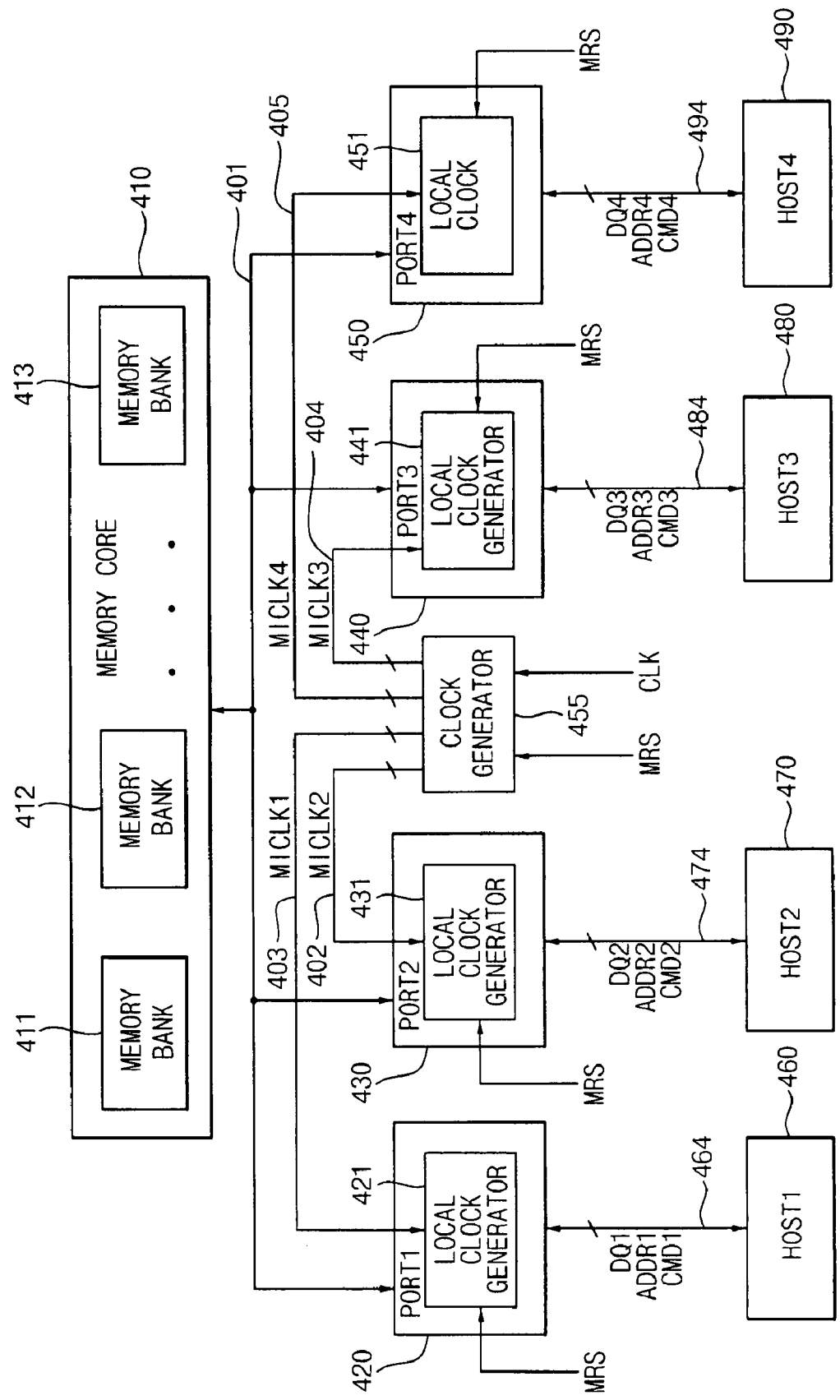
FIG. 10 is a block diagram illustrating a multi-port memory device according to another example embodiment of the present invention.

FIG. 10 is a block diagram illustrating a multi-port memory device 400b according to another example embodiment of the present invention.

In the example embodiment of FIG. 10, the multi-port memory device 400b may have a configuration similar to that of the multi-port memory device 400a shown in FIG. 9. However, the internal clock signals MICLK1, MCLK2, MCLK3, and MCLK4 generated by the clock generator 455 in FIG. 10 may have multiple phases, whereas the internal clock signals ICLK1, ICLK2, ICLK3, and ICLK4 generated by the clock generator 455 in FIG. 9 may each have the same phase.

In the example embodiment of FIG. 10, the internal clock signals MICLK1, MCLK2, MCLK3, and MCLK4 generated by the clock generator 455 may correspond to two clock signals having opposite phases as illustrated in the example embodiment of FIG. 3A. In an alternative example, the internal clock signals MICLK1, MCLK2, MCLK3, and MCLK4 generated by the clock generator 455 may correspond to four clock signals having different phases as illustrated in the example embodiment of FIG. 3B.

In the example embodiment of FIG. 10, while the local clock generators 421, 431, 441 and 451 are illustrated as being positioned "inside" of the ports 420, 430, 440 and 450, the local clock generators 421, 431, 441 and 451 may alternatively be positioned "outside" of the ports 420, 430, 440 and 450, respectively, in other example embodiments of the present invention.

In an example, the multi-port memory device 400b of FIG. 10 may operate similarly to the multi-port memory device 400 shown in FIG. 8, and thus a further description thereof has been omitted for the sake of brevity.

Figure 11:
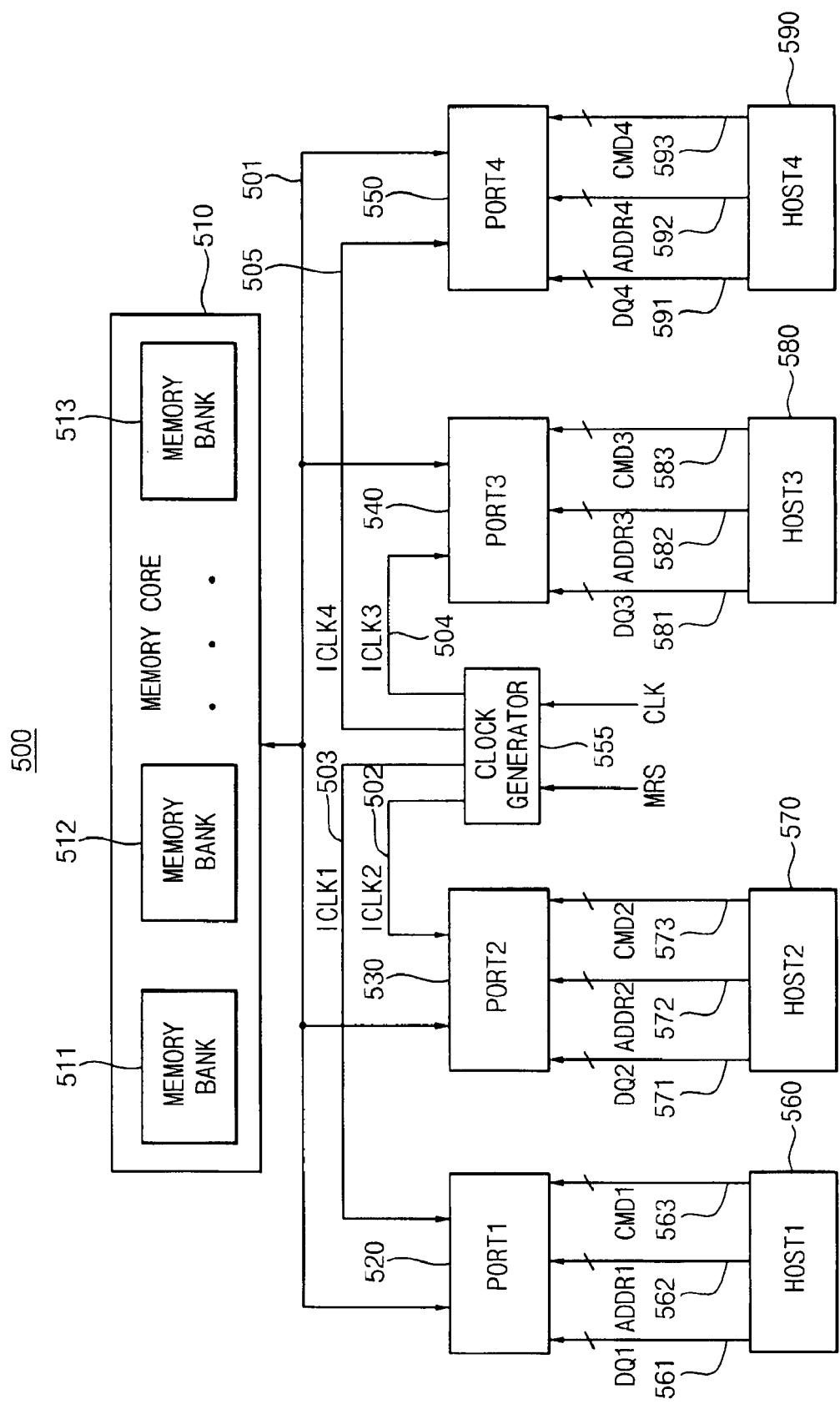
FIG. 11 is a block diagram illustrating a multi-port memory device according to another example embodiment of the present invention.

FIG. 11 is a block diagram illustrating a multi-port memory device 500 according to another example embodiment of the present invention.

In the example embodiment of FIG. 11, the multi-port memory device 500 may include a memory core 510 having memory banks 511, 512 and 513, ports 520, 530, 540 and 550 and a clock generator 555. Further, the multi-port memory device 500 may include hosts 560, 570, 580, and 590 that are coupled to each of the ports 520, 530, 540, and 550, respectively. The clock generator 555 may generate internal clock signals ICLK1, ICLK2, ICLK3, and ICLK4 based on an external clock signal CLK. Each of the internal clock signals ICLK1, ICLK2, ICLK3, and ICLK4 may have a given frequency and bandwidth. In an example, a frequency of the internal clock signals ICLK1, ICLK2, ICLK3, and ICLK4 may be set in response to a MRS signal.

In the example embodiment of FIG. 11, the first internal clock signal ICLK1 may be provided to the first port 520 through a bus 503. The second internal clock signal ICLK2 may be provided to the second port 530 through a bus 502. The third internal clock signal ICLK3 may be provided to the third port 540 through a bus 504. The fourth internal clock signal ICLK4 may be provided to the fourth port 550 through a bus 505.

In the example embodiment of FIG. 11, the first port 520 may provide data DQ1 to the memory core 510 and/or may output data stored in the memory core 510 to an external device in response to the internal clock signal ICLK1, an address signal ADDR1 and a command signal CMD1. The second port 530 may provide data DQ2 to the memory core 510 and/or may output data stored in the memory core 510 to an external device in response to the internal clock signal ICLK2, an address signal ADDR2 and a command signal CMD2. The third port 540 may provide data DQ3 to the memory core 510 and/or may output data stored in the memory core 510 to an external device in response to the internal clock signal ICLK3, an address signal ADDR3 and a command signal CMD3. The fourth port 550 may provide data DQ4 to the memory core 510 and/or may output data stored in the memory core 510 to an external device in response to the internal clock signal ICLK4, an address signal ADDR4 and a command signal CMD4.

In the example embodiment of FIG. 11, the first port (PORT1) 520 may receive an address ADDR1 and a command CMD1 through buses 562 and 563 from the first host (HOST1) 560, and may receive and transmit data DQ1 through a bus 561. The second port (PORT2) 530 may receive an address ADDR2 and a command CMD2 through buses 572 and 573 from the second host (HOST2) 570, and may receive and transmit data DQ2 through a bus 571. The third port (PORT3) 540 may receive an address ADDR3 and a command CMD3 through buses 582 and 583 from the third host (HOST3) 580, and may receive and transmit data DQ3 through a bus 581. The fourth port (PORT4) 550 may receive an address ADDR4 and a command CMD4 through buses 592 and 593 from the fourth host (HOST4) 590, and may receive and transmit data DQ4 through a bus 591.

In the example embodiment of FIG. 11, the internal clock signals ICLK1, ICLK2, ICLK3, and ICLK4 generated by the clock generator 355 may correspond to two clock signals having different frequencies as illustrated in the example embodiment of FIG. 4A. In an alternative example, the internal clock signals ICLK1, ICLK2, ICLK3, and ICLK4 generated by the clock generator 355 may correspond to four clock signals having different frequencies as illustrated in the example embodiment of FIG. 4B.

In the example embodiment of FIG. 11, each of the ports 520, 530, 540 and 550 may receive and transmit an address signal, a command signal and data to and from respective hosts in a parallel transmission mode.

In the example embodiment of FIG. 11, each of the DATA DQ1, DQ2, DQ3, and DQ4 may be transmitted through one of buses 561, 571, 581, and 591. However, input data and output data may be transmitted through different respective buses.

Hereinafter, example operation of the multi-port memory device 500 of FIG. 11 will be described in greater detail.

In example operation of the multi-port memory device 500 of FIG. 11, the internal clock signals ICLK1, ICLK2, ICLK3, and ICLK4 generated by the clock generator 555 may each have different frequencies. Further, the internal clock signals ICLK1, ICLK2, ICLK3, and ICLK4 generated by the clock generator 555 may each have different bandwidths. In an example, a frequency of each of the internal clock signals ICLK1, ICLK2, ICLK3, and ICLK4 generated by the clock generator 555 may be set based on a MRS signal.

In the example embodiment of FIG. 11, the multi-port memory device 500 of FIG. 11 may receive the external clock signal CLK through a given pin (not shown) and may generate the internal clock signals ICLK1, ICLK2, ICLK3, and ICLK4. Accordingly, the multi-port memory device 500 of FIG. 11 may generate clock signals having frequencies and bandwidths "suitable" for or compatible with the ports 520, 530, 540 and 550 without necessarily increasing the number of pins (e.g., without requiring additional pins to receive clock signals at different respective frequencies for compatibility).

Figure 12:
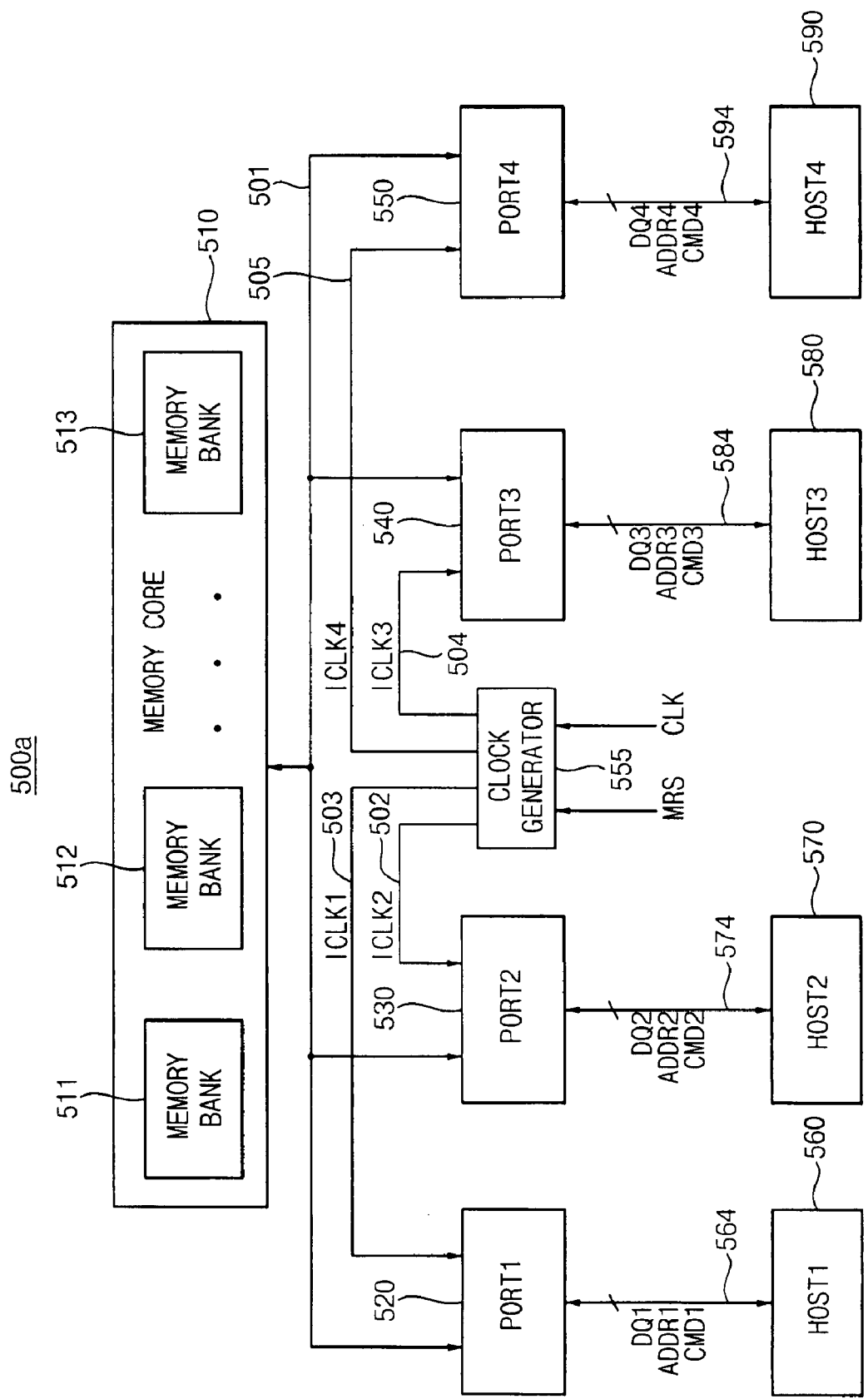
FIG. 12 is a block diagram illustrating a multi-port memory device according to another example embodiment of the present invention.

FIG. 12 is a block diagram illustrating a multi-port memory device 500a according to another example embodiment of the present invention.

In the example embodiment of FIG. 12, the multi-port memory device 500a may have a configuration similar to that of the multi-port memory device 500 shown in FIG. 11. However, the multi-port memory device 500a may receive and transmit an address signal, a command signal and data to and from respective hosts in a serial transmission mode, whereas the multi-port memory device 500 shown in FIG. 11 may be configured to operate in accordance with a parallel transmission mode.

In the example embodiment of FIG. 12, the first port (PORT1) 520 may receive an address ADDR1, a command CMD1, and data DQ1 through a bus 564 from the first host (HOST1) 560. The second port (PORT2) 530 may receive an address ADDR2, a command CMD2, and data DQ2 through a bus 574 from the second host (HOST2) 570. The third port (PORT3) 540 may receive an address ADDR3, a command CMD3, and data DQ3 through a bus 584 from the third host (HOST3) 580. The fourth port (PORT4) 550 may receive an address ADDR4, a command CMD4, and data DQ4 through a bus 594 from the fourth host (HOST4) 590.

In the example embodiment of FIG. 12, the multi-port memory device 500a may operate similarly to that of the multi-port memory device 500 shown in FIG. 11, and thus a further description thereof has been omitted for the sake of brevity.

Figure 13:
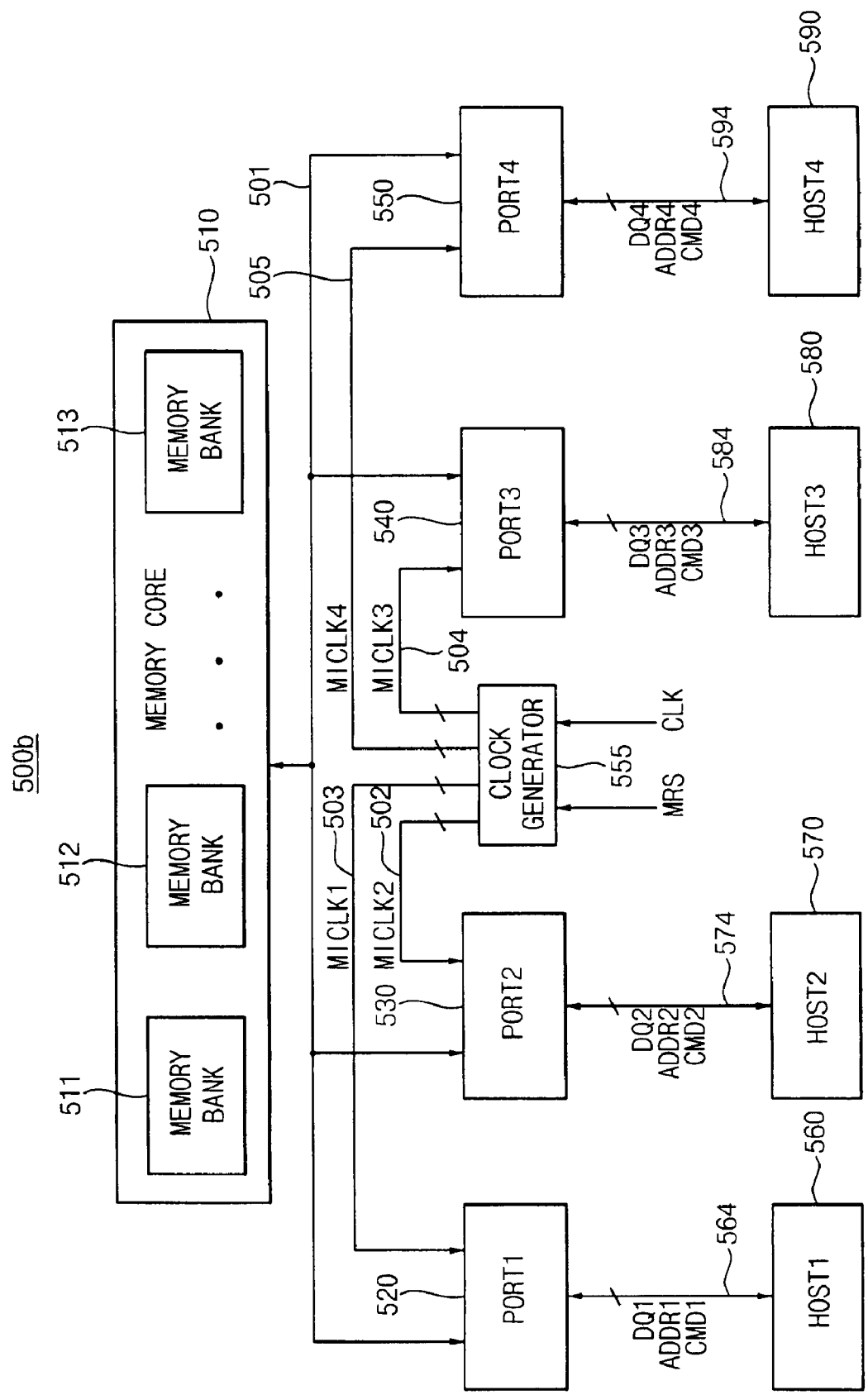
FIG. 13 is a block diagram illustrating a multi-port memory device according to another example embodiment of the present invention.

FIG. 13 is a block diagram illustrating a multi-port memory device 500b according to another example embodiment of the present invention.

In the example embodiment of FIG. 13, the multi-port memory device 500b shown in FIG. 13 may have a configuration similar to that of the multi-port memory device 500a shown in FIG. 12. However, the internal clock signals MICLK1, MCLK2, MCLK3, and MCLK4 generated by the clock generator 555 in FIG. 13 may include multiple phases, whereas the internal clock signals ICLK1, ICLK2, ICLK3, and ICLK4 generated by the clock generator 555 in FIG. 12 may each have the same phase.

In the example embodiment of FIG. 13, the internal clock signals MICLK1, MCLK2, MCLK3, and MCLK4 generated by the clock generator 555 may correspond to two clock signals having opposite phases as illustrated in the example embodiment of FIG. 3A. In an alternative example, the internal clock signals MICLK1, MCLK2, MCLK3, and MCLK4 generated by the clock generator 555 may correspond to four clock signals having different phases as illustrated in the example embodiment of FIG. 3B.

In the example, the multi-port memory device 500b of FIG. 13 may operate similarly to that of the multi-port memory device 500 shown in FIG. 11, and thus a further description thereof has been omitted for the sake of brevity.

Figure 14:
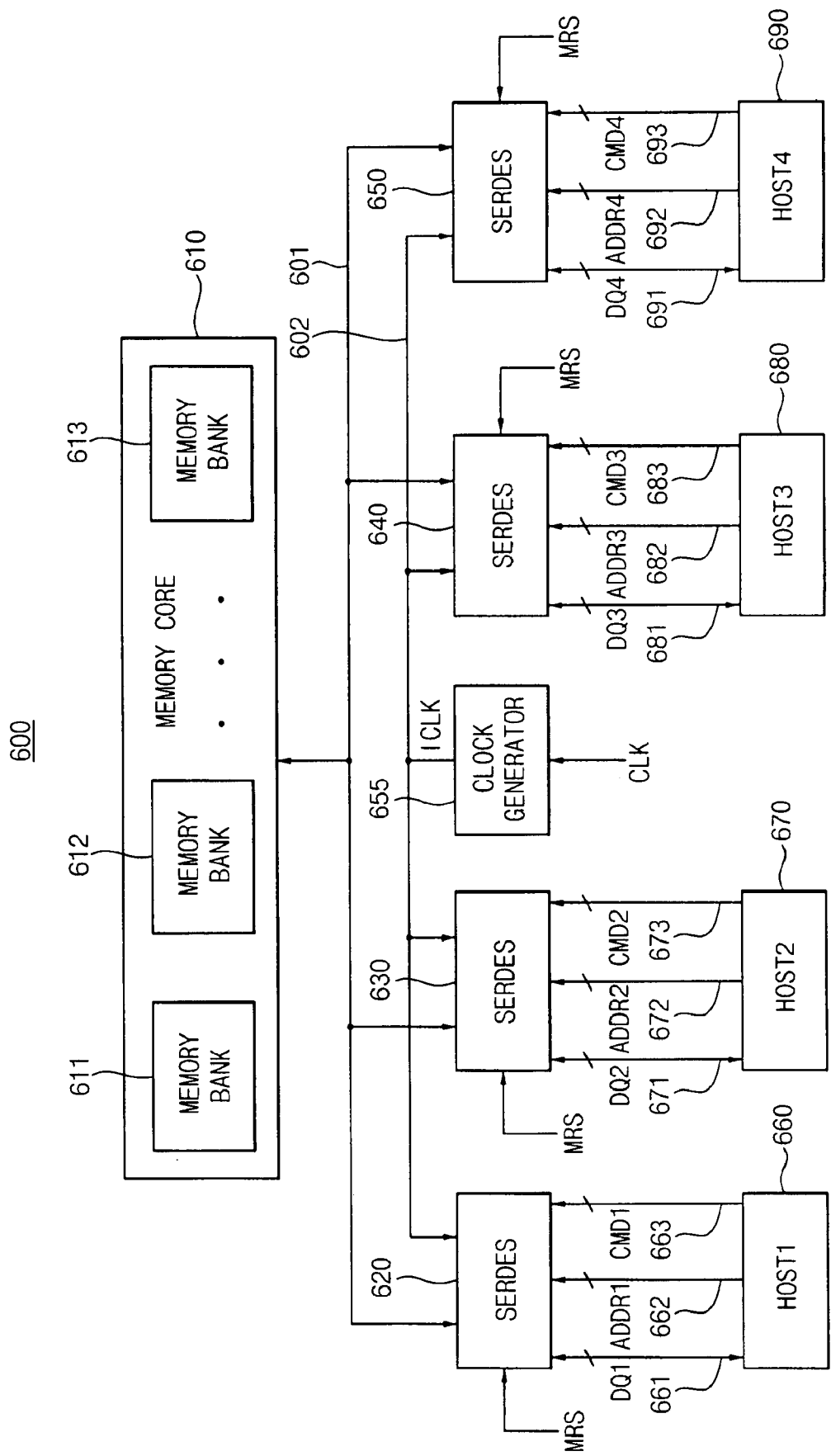
FIG. 14 is a block diagram illustrating a multi-port memory device according to another example embodiment of the present invention.

FIG. 14 is a block diagram illustrating a multi-port memory device 600 according to another example embodiment of the present invention.

In the example embodiment of FIG. 14, the multi-port memory device 600 may include a memory core 610 having memory banks 611, 612 and 613, SERDESs 620, 630, 640 and 650 and a clock generator 655. As used herein, "SERDES" may denote a Serializer/Deserializer. The internal clock signal ICLK may be provided to the SERDESs 620, 630, 640 and 650 through a bus 602. The SERDESs 620, 630, 640 and 650 may generate first to fourth local clock signals respectively having a given frequency and a given bandwidth based on the internal clock signal ICLK. In an example, a frequency of the respective local clock signals generated by the SERDESs 620, 630, 640 and 650 may be set in response to a MRS signal.

In the example embodiment of FIG. 14, the first SERDES 620 may provide data DQ1 to the memory core 610 and/or may output data stored in the memory core 610 to an external device through a bus 601 in response to the first local clock signal, an address signal ADDR1 and a command signal CMD1. The second SERDES 630 may provide data DQ2 to the memory core 610 and/or may output data stored in the memory core 610 to an external device through a bus 601 in response to the second local clock signal, an address signal ADDR2 and a command signal CMD2. The third SERDES 640 may provide data DQ3 to the memory core 610 and/or may output data stored in the memory core 610 to an external device through a bus 601 in response to the third local clock signal, an address signal ADDR3 and a command signal CMD3. The fourth SERDES 650 may provide data DQ4 to the memory core 610 and/or may output data stored in the memory core 610 to an external device through a bus 601 in response to the fourth local clock signal, an address signal ADDR4 and a command signal CMD4.

In the example embodiment of FIG. 14, the first SERDES 620 may receive an address ADDR1 and a command CMD1 through buses 662 and 663 from the first host (HOST1) 660, and may receive and transmit data DQ1 through a bus 661. The second SERDES 630 may receive an address ADDR2 and a command CMD2 through buses 672 and 673 from the second host (HOST2) 670, and may receive and transmit data DQ2 through a bus 671. The third SERDES 640 may receive an address ADDR3 and a command CMD3 through buses 682 and 683 from the third host (HOST3) 680, and may receive and transmit data DQ3 through a bus 681. The fourth port 650 may receive an address ADDR4 and a command CMD4 through buses 692 and 693 from the fourth host (HOST4) 690, and may receive and transmit data DQ4 through a bus 691.

As illustrated in the example embodiment of FIG. 14, each of the SERDESs 620, 630, 640 and 650 may receive and transmit an address signal, a command signal and data to and from respective hosts in a parallel transmission mode.

In the example embodiment of FIG. 14, each of the DATA DQ1, DQ2, DQ3, and DQ4 may be transmitted through one of buses 661, 671, 681, and 691. In an example, input data and output data may be transmitted through different respective buses.

Hereinafter, example operation of the multi-port memory device 600 shown in FIG. 14 will be described in greater detail.

In example operation of the multi-port memory device 600 of FIG. 14, the SERDES (Serializer/Deserializer) (e.g., SERDES 620, 630, 640, 650, etc.) may be a circuit block configured to convert data input in a serial transmission mode into parallel data, or may alternatively convert data input in a parallel mode into serial data. Further, the SERDES may be configured to adjust (e.g., increase or decrease) a frequency of a received clock signal.

In example operation of the multi-port memory device 600 of FIG. 14, the internal clock signal ICLK generated by the clock generator 655 may have a given frequency and a given phase. Further, the internal clock signal ICLK generated by the clock generator 655 may have a given bandwidth. The SERDESs 620, 630, 640 and 650 may each convert the internal clock signal ICLK into local clock signals having different respective frequencies and bandwidths suitable for the hosts 660, 670, 680, and 690. Thus, the different respective frequencies and/or bandwidths of the local clock signals may be generated via an adjustment to the internal clock signal ICLK by the SERDESs 620, 630, 640 and 650, respectively.

In example operation of the multi-port memory device 600 of FIG. 14, the multi-port memory device 600 may receive the external clock signal CLK through a given pin (not shown) and may generate the internal clock signal ICLK. Further, the multi-port memory device 600 of FIG. 14 may generate local clock signals having frequencies and bandwidths "suitable" for or compatible with the hosts 660, 670, 680, and 690 that correspond to SERDESs 620, 630, 640 and 650, respectively, using the SERDESs 620, 630, 640 and 650, respectively. Accordingly, the multi-port memory device 600 of FIG. 14 may generate clock signals having frequencies and bandwidths suitable for or compatible with the hosts 660, 670, 680 and 690 without necessarily increasing the number of pins (e.g., without requiring additional pins to receive clock signals at different respective frequencies for compatibility). In an example, a frequency of the respective local clock signals generated by the SERDESs 620, 630, 640 and 650 may be set in response to a MRS signal.

Figure 15:
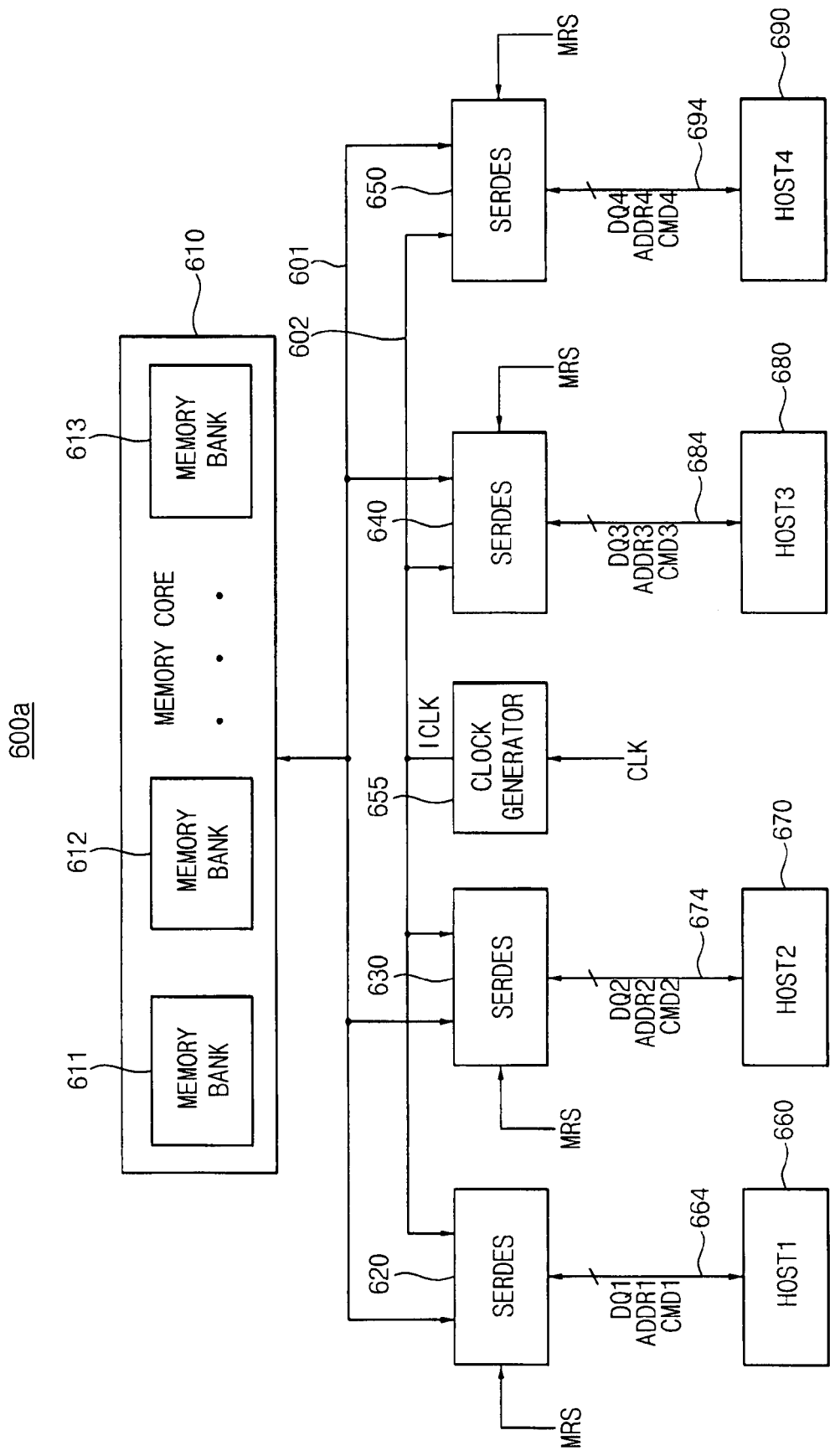
FIG. 15 is a block diagram illustrating a multi-port memory device according to another example embodiment of the present invention.

FIG. 15 is a block diagram illustrating a multi-port memory device 600a according to another example embodiment of the present invention.

In the example embodiment of FIG. 15, the multi-port memory device 600a may have a configuration similar to that of the multi-port memory device 600 shown in FIG. 14. However, the multi-port memory device 600a may receive and transmit an address signal, a command signal and data to and from respective hosts in a serial transmission mode, whereas the multi-port memory device 600 shown in FIG. 14 may operate in accordance with a parallel transmission mode.

In the example embodiment of FIG. 15, the first SERDES 620 may receive an address ADDR1, a command CMD1, and data DQ1 through a bus 664 from the first host (HOST1) 660.

The second SERDES 630 may receive an address ADDR2, a command CMD2, and data DQ2 through a bus 674 from the second host (HOST2) 670. The third SERDES 640 may receive an address ADDR3, a command CMD3, and data DQ3 through a bus 684 from the third host (HOST3) 680. The fourth SERDES 650 may receive an address ADDR4, a command CMD4, and data DQ4 through a bus 694 from the fourth host (HOST4) 690.

In the example embodiment of FIG. 15, the multi-port memory device 600a may operate similarly to that of the multi-port memory device 600 shown in FIG. 14, and thus a further description thereof has been omitted for the sake of brevity.

Figure 16:
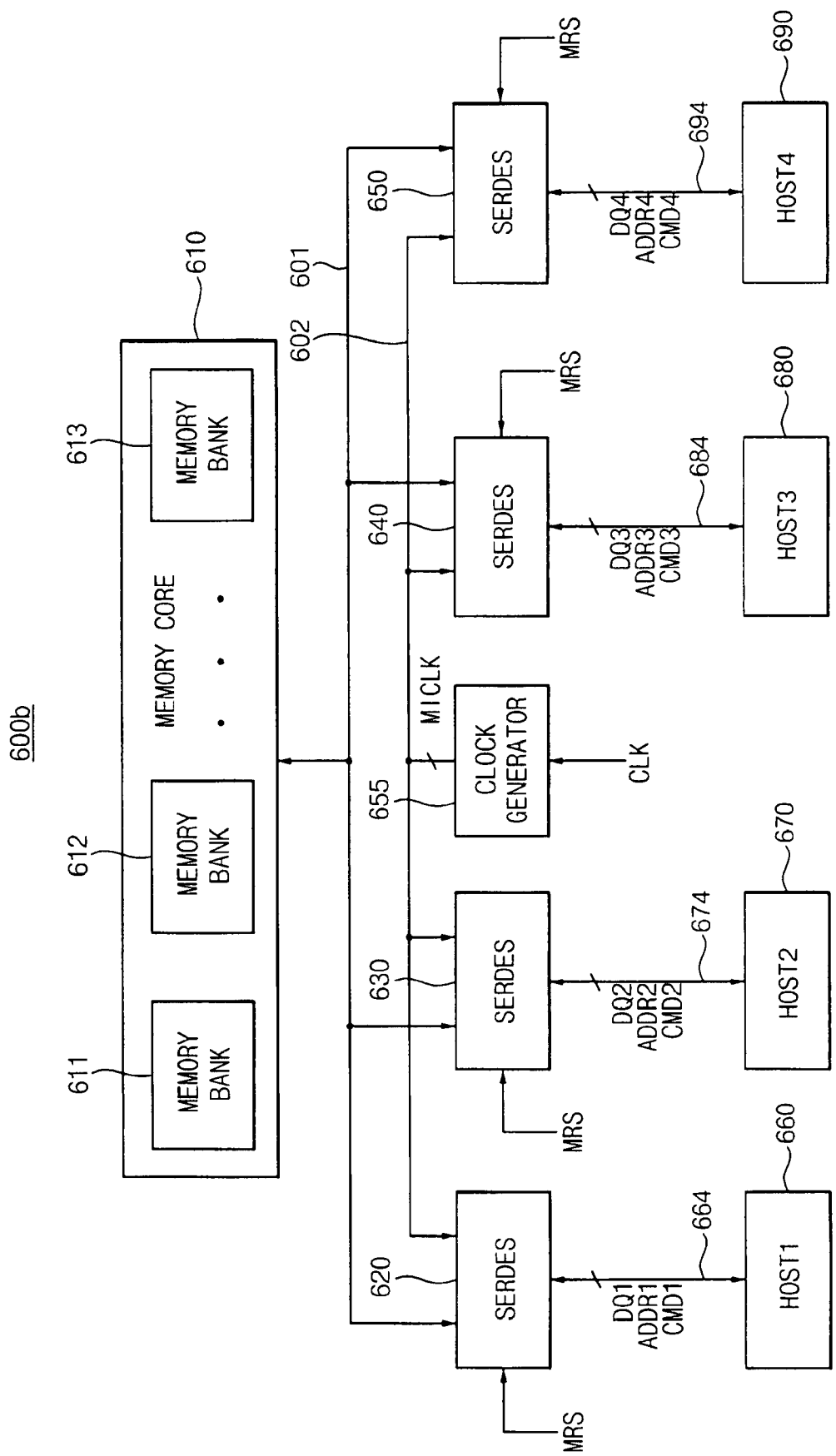
FIG. 16 is a block diagram illustrating a multi-port memory device according to another example embodiment of the present invention.

FIG. 16 is a block diagram illustrating a multi-port memory device 600b according to another example embodiment of the present invention.

In the example embodiment of FIG. 16, the multi-port memory device 600b may have a configuration similar to that of the multi-port memory device 600a shown in FIG. 15. However, the internal clock signal MICLK generated by the clock generator 655 in FIG. 16 may have the capacity to conform to multiple phases (e.g., an adjustable phase), whereas the internal clock signal ICLK generated by the clock generator 655 in FIG. 15 may have the same phase.

In the example embodiment of FIG. 16, the internal clock signal MICLK generated by the clock generator 655 may correspond to two clock signals having opposite phases as illustrated in the example embodiment of FIG. 3A. In an alternative example, the internal clock signal MICLK generated by the clock generator 655 may correspond to four clock signals having different phases as illustrated in the example embodiment of FIG. 3B.

In the example embodiment of FIG. 16, the multi-port memory device 600b may operate similarly to the multi-port memory device 600 shown in FIG. 14, and thus a further description thereof has been omitted for the sake of brevity.

Figure 17:
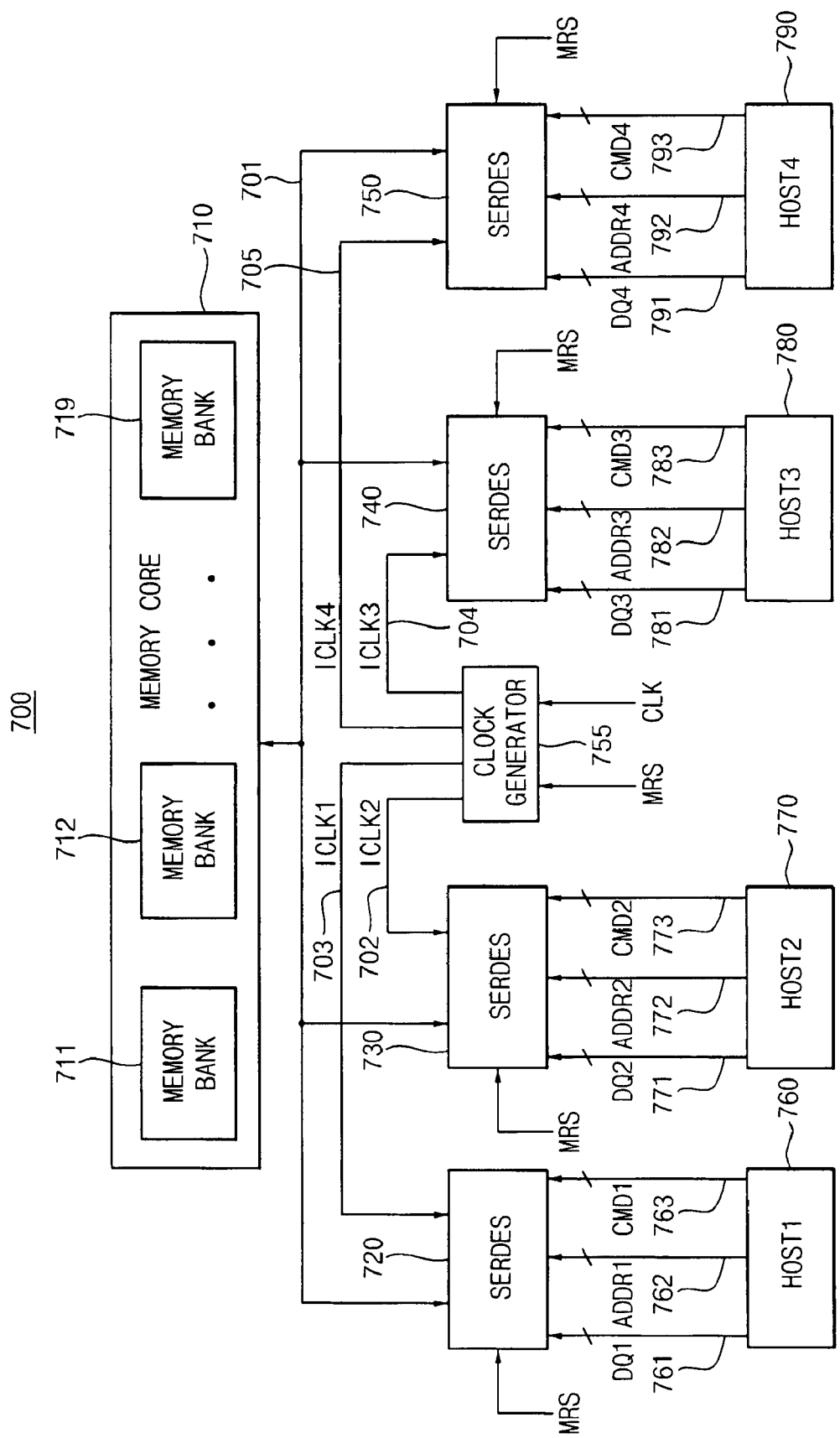
FIG. 17 is a block diagram illustrating a multi-port memory device according to another example embodiment of the present invention.

FIG. 17 is a block diagram illustrating a multi-port memory device 700 according to another example embodiment of the present invention.

In the example embodiment of FIG. 17, the multi-port memory device 700 may include a memory core 710 having memory banks 711, 712 and 713, SERDESs 720, 730, 740 and 750 and a clock generator 755. The clock generator 755 may generate internal clock signals ICLK1, ICLK2, ICLK3, and ICLK4 based on an external clock signal CLK. Each of the internal clock signals ICLK1, ICLK2, ICLK3, and ICLK4 may have a given frequency and bandwidth. In an example, a frequency of the respective internal clock signals ICLK1, ICLK2, ICLK3, and ICLK4 may be set in response to a MRS signal.

In the example embodiment of FIG. 17, the first internal clock signal ICLK1 may be provided to the first SERDES 720 through a bus 703. The second internal clock signal ICLK2 may be provided to the second SERDES 730 through a bus 702. The third internal clock signal ICLK3 may be provided to the third SERDES 740 through a bus 704. The fourth internal clock signal ICLK4 may be provided to the fourth SERDES 750 through a bus 705.

In the example embodiment of FIG. 17, the first SERDES 720 may provide data DQ1 to the memory core 710 and/or may output data stored in the memory core 710 to an external device through a bus 701 in response to the internal clock signal ICLK1 an address signal ADDR1 and a command signal CMD1. The second SERDES 730 may provide data DQ2 to the memory core 710 and/or may output data stored in the memory core 710 to an external device through the bus 701 in response to the internal clock signal ICLK2, an address signal ADDR2 and a command signal CMD2. The third SERDES 740 may provide data DQ3 to the memory core 710 and/or may output data stored in the memory core 710 to an external device through the bus 701 in response to the internal clock signal ICLK3, an address signal ADDR3 and a command signal CMD3. The fourth SERDES 750 may provide data DQ4 to the memory core 710 and/or may output data stored in the memory core 710 to an external device through the bus 701 in response to the internal clock signal ICLK4, an address signal ADDR4 and a command signal CMD4.

In the example embodiment of FIG. 17, the first SERDES 720 may receive an address ADDR1 and a command CMD1 through buses 762 and 763 from the first host (HOST1) 760, and may receive and transmit data DQ1 through a bus 761. The second SERDES 730 may receive an address ADDR2 and a command CMD2 through buses 772 and 773 from the second host (HOST2) 770, and may receive and transmit data DQ2 through a bus 771. The third SERDES 740 may receive an address ADDR3 and a command CMD3 through buses 782 and 783 from the third host (HOST3) 780, and may receive and transmit data DQ3 through a bus 781. The fourth SERDES 750 may receive an address ADDR4 and a command CMD4 through buses 792 and 793 from the fourth host (HOST4) 790, and may receive and transmit data DQ4 through a bus 791.

As illustrated in the example embodiment of FIG. 17, each of the SERDESs 720, 730, 740 and 750 may receive and transmit an address signal, a command signal and data to and from respective hosts in a parallel transmission mode.

In the example embodiment of FIG. 17, each of the DATA DQ1, DQ2, DQ3, and DQ4 may be transmitted through one of buses 761, 771, 781 and/or 791. In an example, input data and output data may be transmitted through different respective buses.

Hereinafter, example operation of the multi-port memory device 700 shown in FIG. 17 will be described in greater detail.

In example operation of the multi-port memory device 700 of FIG. 17, each of the SERDESs 720, 730, 740, and 750 included in the multi-port memory device 700 shown in FIG. 17 may have a function which corresponds to that of the ports 520, 530, 540, and 550, respectively, included in the multi-port memory device 500 shown in FIG. 11.

In example operation of the multi-port memory device 700 of FIG. 17, the internal clock signals ICLK1, ICLK2, ICLK3, and ICLK4 generated by the clock generator 755 may each have different frequencies. Further, the internal clock signals ICLK1, ICLK2, ICLK3, and ICLK4 generated by the clock generator 755 may each have different bandwidths. In an example, a frequency of the respective internal clock signals ICLK1, ICLK2, ICLK3, and ICLK4 generated by the clock generator 755 may be set based on a MRS signal. The SERDESs 720, 730, 740, and 750 may generate local clock signals based on the internal clock signals ICLK1, ICLK2, ICLK3, and ICLK4 in response to the MRS signal.

In example operation of the multi-port memory device 700 of FIG. 17, the multi-port memory device 700 may receive the external clock signal CLK through a given pin (not shown) and may generate the internal clock signals ICLK1, ICLK2, ICLK3, and ICLK4 for the SERDESs 720, 730, 740, and 750, respectively. The SERDESs 720, 730, 740, and 750 may generate local clock signals having frequencies and bandwidths "suitable" for or compatible with the hosts 760, 770, 780, and 790 that correspond to SERDESs 720, 730, 740 and 750, respectively. Further, each of the SERDESs 720, 730, 740, and 750 may select one of the internal clock signals ICLK1, ICLK2, ICLK3, and ICLK4 in response to the MRS signal. Therefore, the multi-port memory device 700 of FIG. 17 may generate clock signals having frequencies and bandwidths suitable for or compatible with the SERDESs 720, 730, 740 and 750 corresponding to ports without necessarily increasing the number of pins (e.g., without requiring additional pins to receive clock signals at different respective frequencies for compatibility). In an example, a frequency of the respective local clock signals generated by the SERDESs 620, 630, 640 and 650 may be set in response to a MRS signal.

Figure 18:
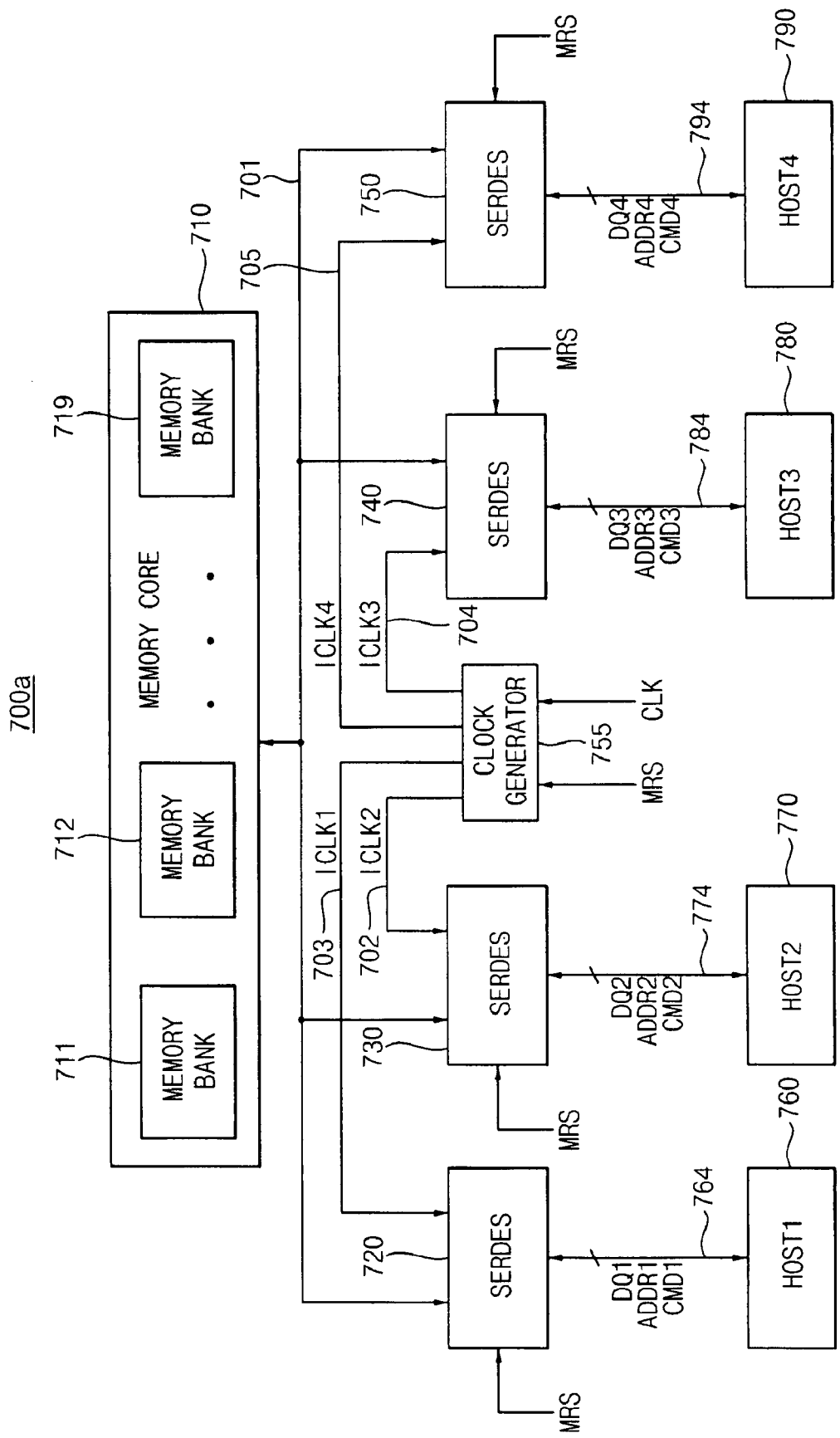
FIG. 18 is a block diagram illustrating a multi-port memory device according to another example embodiment of the present invention.

FIG. 18 is a block diagram illustrating a multi-port memory device 700a according to another example embodiment of the present invention.

In the example embodiment of FIG. 18, the multi-port memory device 700a shown in FIG. 18 may have a configuration similar to that of the multi-port memory device 700 shown in FIG. 17. However, the multi-port memory device 700a may receive and transmit an address signal, a command signal and data to and from respective hosts in a serial transmission mode, whereas the multi-port memory device 700 shown in FIG. 17 may operate in accordance with a parallel transmission mode.

In the example embodiment of FIG. 18, the first SERDES 720 may receive an address ADDR1, a command CMD1, and data DQ1 through a bus 764 from the first host (HOST1) 760. The second SERDES 730 may receive an address ADDR2, a command CMD2, and data DQ2 through a bus 774 from the second host (HOST2) 770. The third SERDES 740 may receive an address ADDR3, a command CMD3, and data DQ3 through a bus 784 from the third host (HOST3) 780. The fourth SERDES 750 may receive an address ADDR4, a command CMD4, and data DQ4 through a bus 794 from the fourth host (HOST4) 790.

In the example embodiment of FIG. 18, the multi-port memory device 700a shown in FIG. 18 may operate similarly to that of the multi-port memory device 700 shown in FIG. 17, and thus a further description thereof has been omitted for the sake of brevity.

Figure 19:
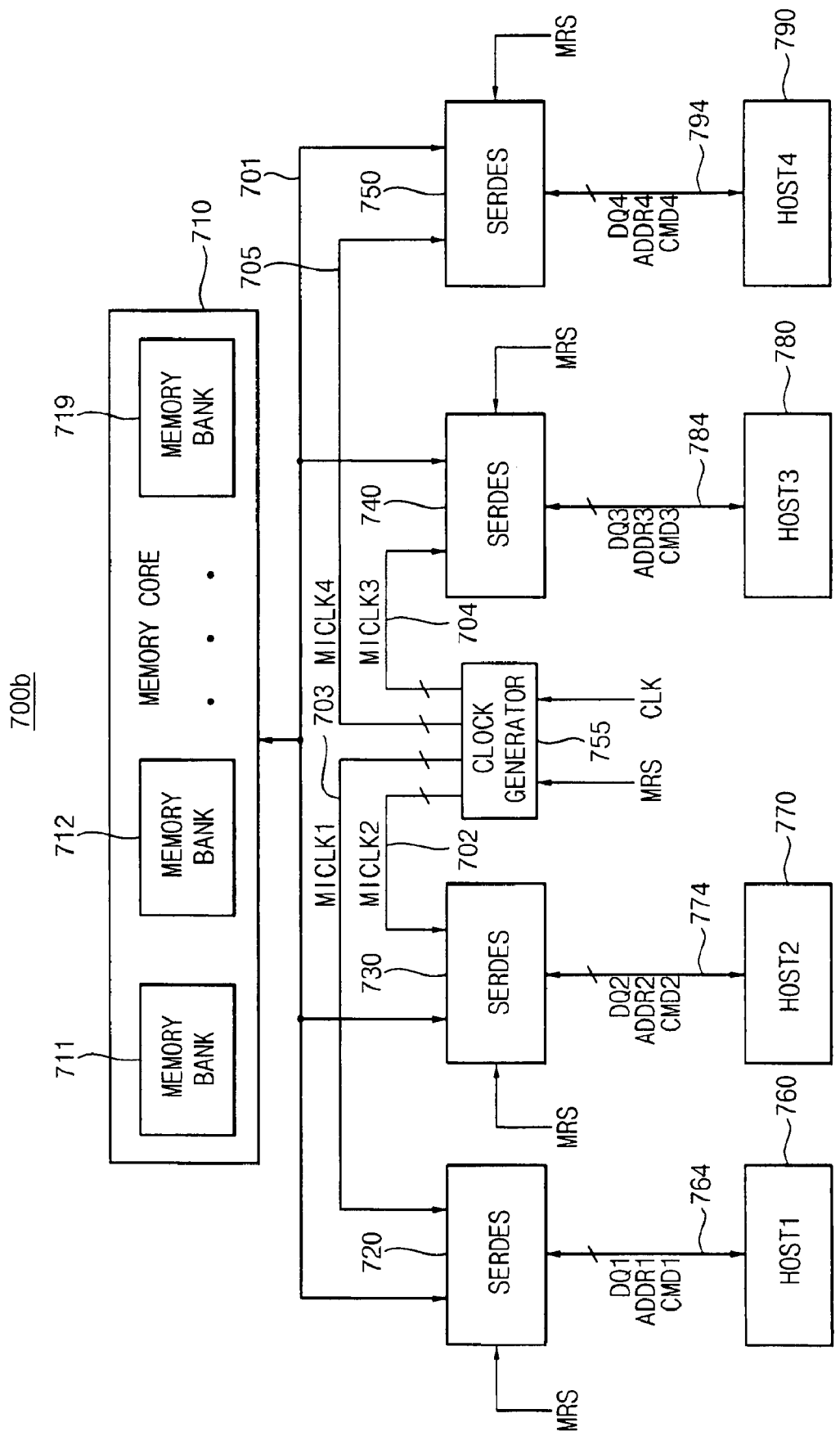
FIG. 19 is a block diagram illustrating a multi-port memory device according to another example embodiment of the present invention.

FIG. 19 is a block diagram illustrating a multi-port memory device 700b according to another example embodiment of the present invention.

In the example embodiment of FIG. 19, the multi-port memory device 700b shown in FIG. 19 may have a configuration similar to that of the multi-port memory device 700a shown in FIG. 18. However, the internal clock signals MICLK1, MCLK2, MCLK3, and MCLK4 generated by the clock generator 755 in FIG. 19 may include multiple phases, whereas the internal clock signals ICLK1, ICLK2, ICLK3, and ICLK4 generated by the clock generator 755 in FIG. 18 may each include the same phase.

In the example embodiment of FIG. 19, the internal clock signals MICLK1, MCLK2, MCLK3, and MCLK4 generated by the clock generator 755 may correspond to two clock signals having opposite phases as illustrated in the example embodiment of FIG. 3A. In an alternative example, the internal clock signals MICLK1, MCLK2, MCLK3, and MCLK4 generated by the clock generator 755 may correspond to four clock signals having different phases as illustrated in the example embodiment of FIG. 3B.

In the example embodiment of FIG. 19, the multi-port memory device 700b may operate similarly to that of the multi-port memory device 700 shown in FIG. 17, and thus a further description thereof has been omitted for the sake of brevity.

Figure 20:
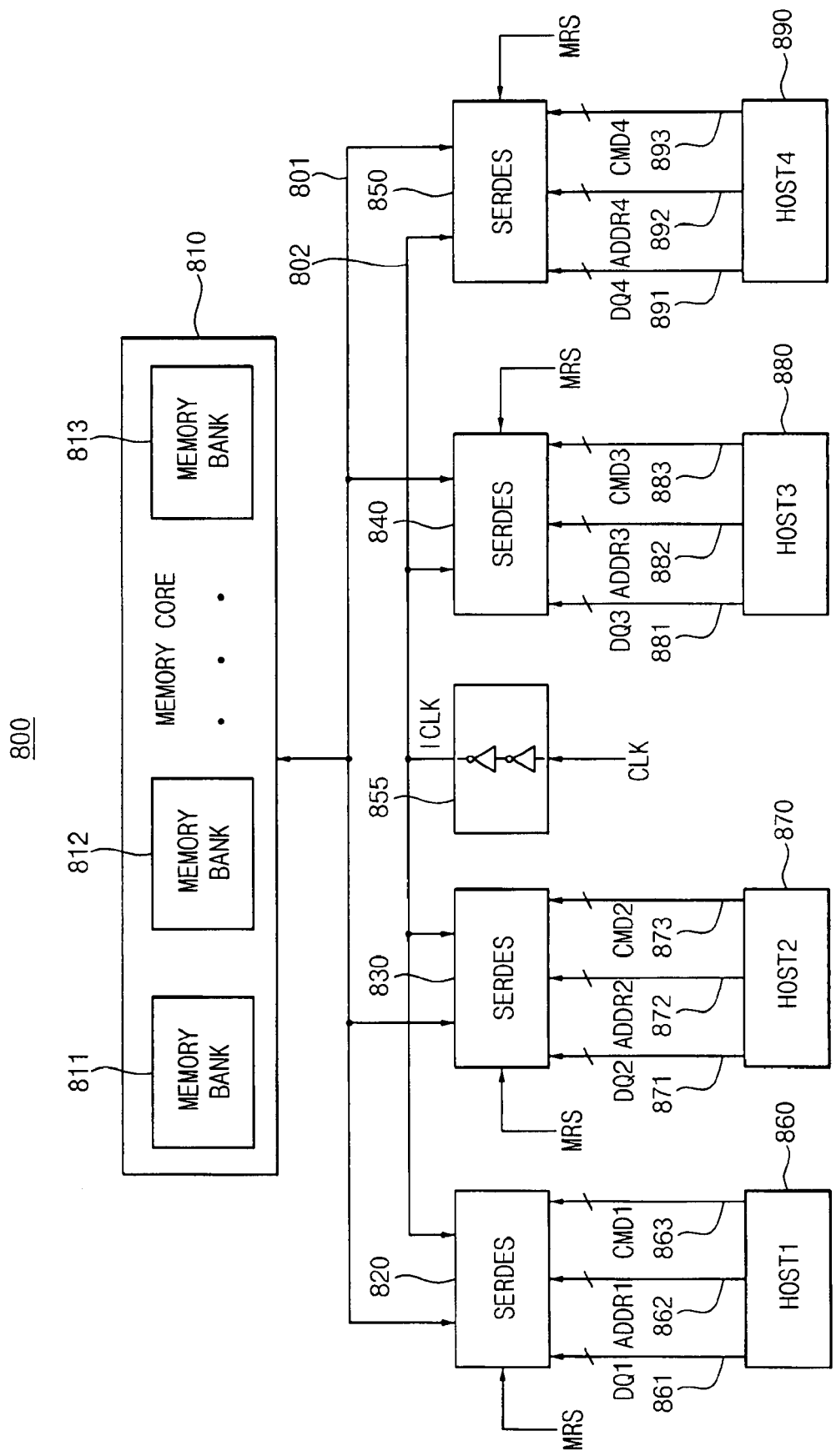
FIG. 20 is a block diagram illustrating a multi-port memory device according to another example embodiment of the present invention.

FIG. 20 is a block diagram illustrating a multi-port memory device 800 according to another example embodiment of the present invention. The multi-port memory device 800 of FIG. 20 may include a buffer 855 instead of the clock generator 655 included in the multi-port memory device 655 shown in FIG. 14.

In the example embodiment of FIG. 20, the multi-port memory device 800 may include a memory core 810 having memory banks 811, 812 and 813, SERDESs 820, 830, 840 and 850 and a buffer 855. The internal clock signal ICLK may be provided to the SERDESs 820, 830, 840 and 850 through a bus 802. The SERDESs 820, 830, 840 and 850 may generate first to fourth local clock signals, respectively, (not shown) with each of the first to fourth local clock signals having a given frequency and a given bandwidth based on the internal clock signal ICLK. In an example, frequencies of the respective local clock signals generated by the SERDESs 820, 830, 840 and 850 may be set in response to a MRS signal.

In the example embodiment of FIG. 20, the first SERDES 820 may provide data DQ1 to the memory core 810 and/or may output data stored in the memory core 810 to an external device through a bus 801 in response to the first local clock signal, an address signal ADDR1 and a command signal CMD1. The second SERDES 830 may provide data DQ2 to the memory core 810 and/or may output data stored in the memory core 810 to an external device through a bus 801 in response to the second local clock signal, an address signal ADDR2 and a command signal CMD2. The third SERDES 840 may provide data DQ3 to the memory core 810 and/or may output data stored in the memory core 810 to an external device through a bus 801 in response to the third local clock signal, an address signal ADDR3 and a command signal CMD3. The fourth SERDES 850 may provide data DQ4 to the memory core 810 and/or may output data stored in the memory core 810 to an external device through a bus 801 in response to the fourth local clock signal, an address signal ADDR4 and a command signal CMD4.

In the example embodiment of FIG. 20, the first SERDES 820 may receive an address ADDR1 and a command CMD1 through buses 862 and 863 from the first host (HOST1) 860, and may receive and transmit data DQ1 through a bus 861. The second SERDES 830 may receive an address ADDR2 and a command CMD2 through buses 872 and 873 from the second host (HOST2) 870, and may receive and transmit data DQ2 through a bus 871. The third SERDES 840 may receive an address ADDR3 and a command CMD3 through buses 882 and 883 from the third host (HOST3) 880, and may receive and transmit data DQ3 through a bus 881. The fourth port 850 may receive an address ADDR4 and a command CMD4 through buses 892 and 893 from the fourth host (HOST4) 890, and may receive and transmit data DQ4 through a bus 891.

As illustrated in the example embodiment of FIG. 20, each of the SERDESs 820, 830, 840 and 850 may receive and transmit an address signal, a command signal and data to and from respective hosts in a parallel transmission mode.

In the example embodiment of FIG. 20, each of the DATA DQ1, DQ2, DQ3, and DQ4 may be transmitted through one of buses 861, 871, 881 and/or 891. In an example, input data and output data may be transmitted through different respective buses.

Hereinafter, example operation of the multi-port memory device 800 shown in FIG. 24 will be described in greater detail.

In example operation of the multi-port memory device 800 of FIG. 20, the buffer 855 may buffer the external clock signal CLK to generate the internal clock signal ICLK. Therefore, in an example, the frequency of the internal clock signal ICLK may be equal to the frequency of the external clock signal CLK. The internal clock signal ICLK generated by the buffer 855 may have a given frequency and a given phase. Further, the internal clock signal ICLK generated by the buffer 855 may have a given bandwidth. The SERDESs 820, 830, 840 and 850 may convert or adjust the internal clock signal ICLK into local clock signals having different frequencies and bandwidths suitable for or compatible the hosts 860, 870, 880, and 890 that correspond to SERDESs 820, 830, 840 and 850 respectively.

In example operation of the multi-port memory device 800 of FIG. 20, the multi-port memory device 800 may receive the external clock signal CLK through a given pin (not shown) and may generate the internal clock signal ICLK. Further, the multi-port memory device 800 of FIG. 20 may generate local clock signals having frequencies and bandwidths suitable for or compatible with the hosts 860, 870, 880, and 890 that correspond to SERDESs 820, 830, 840 and 850, respectively. Accordingly, the multi-port memory device 800 of FIG. 20 may generate clock signals having frequencies and bandwidths suitable for or compatible with the hosts 860, 870, 880 and 890 without necessarily increasing the number of pins (e.g., without requiring additional pins to receive clock signals at different respective frequencies for compatibility). In an example, a frequency of the respective local clock signals generated by the SERDESs 620, 630, 640 and 650 may be set in response to a MRS signal. In an example, a frequency of the local clock signals generated by the SERDESs 820, 830, 840 and 850 may be set in response to a MRS signal.

Figure 21:
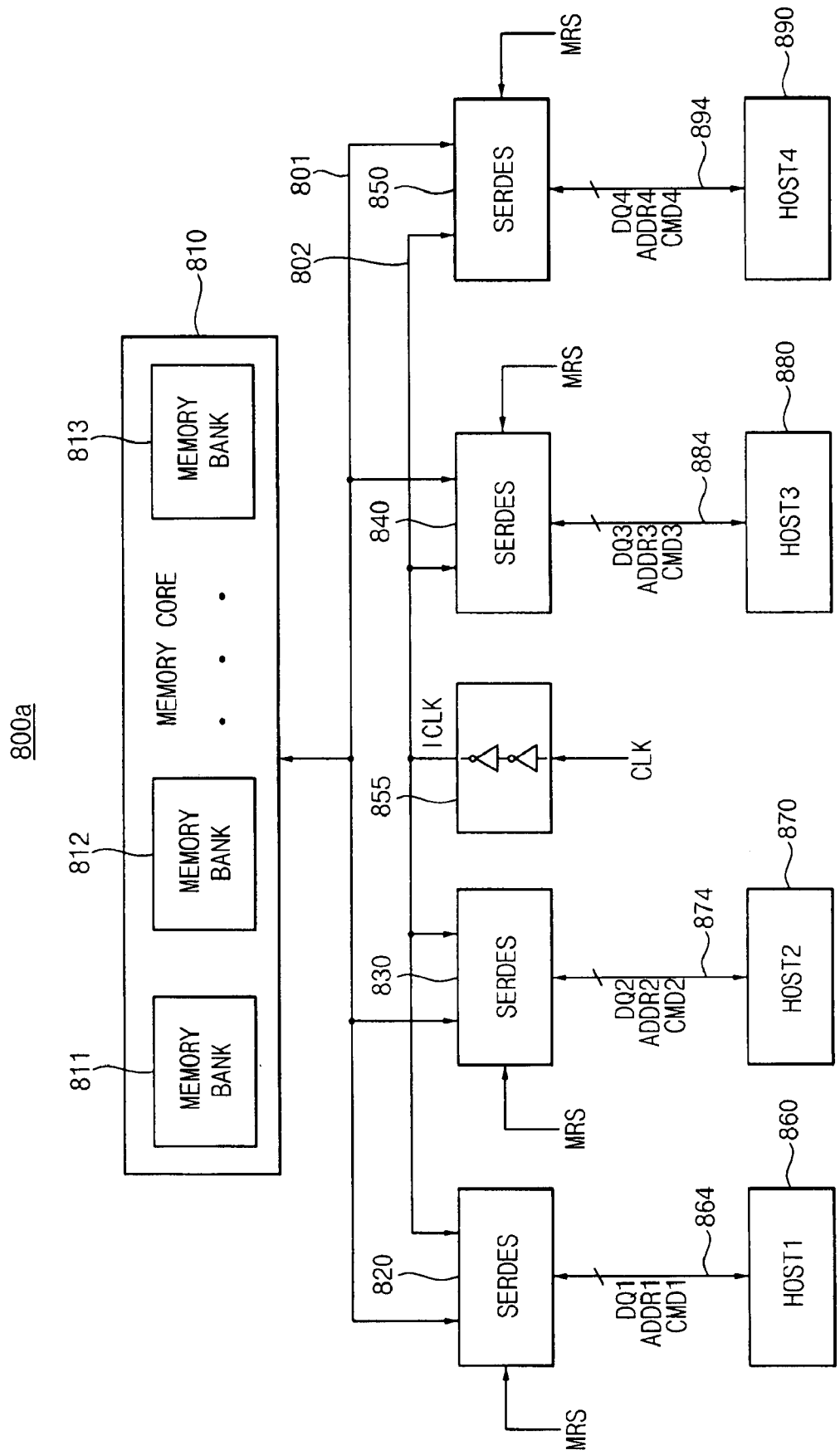
FIG. 21 is a block diagram illustrating a multi-port memory device according to another example embodiment of the present invention.

FIG. 21 is a block diagram illustrating a multi-port memory device 800a according to another example embodiment of the present invention.

In the example embodiment of FIG. 21, the multi-port memory device 800a shown in FIG. 21 may have a configuration similar to that of the multi-port memory device 800 shown in FIG. 20. However, the multi-port memory device 800a may receive and transmit an address signal, a command signal and data to and from respective hosts in a serial transmission mode, whereas the multi-port memory device 800 shown in FIG. 20 may operate in accordance with a parallel transmission mode.

In the example embodiment of FIG. 21, the first SERDES 820 may receive an address ADDR1, a command CMD1, and data DQ1 through a bus 864 from the first host (HOST1) 860. The second SERDES 830 may receive an address ADDR2, a command CMD2, and data DQ2 through a bus 874 from the second host (HOST2) 870. The third SERDES 840 may receive an address ADDR3, a command CMD3, and data DQ3 through a bus 884 from the third host (HOST3) 880. The fourth SERDES 850 may receive an address ADDR4, a command CMD4, and data DQ4 through a bus 894 from the fourth host (HOST4) 890.

In an example, the multi-port memory device 800a may operate similarly to the multi-port memory device 800 shown in FIG. 20, and thus a further description thereof has been omitted for the sake of brevity.

Figure 22:
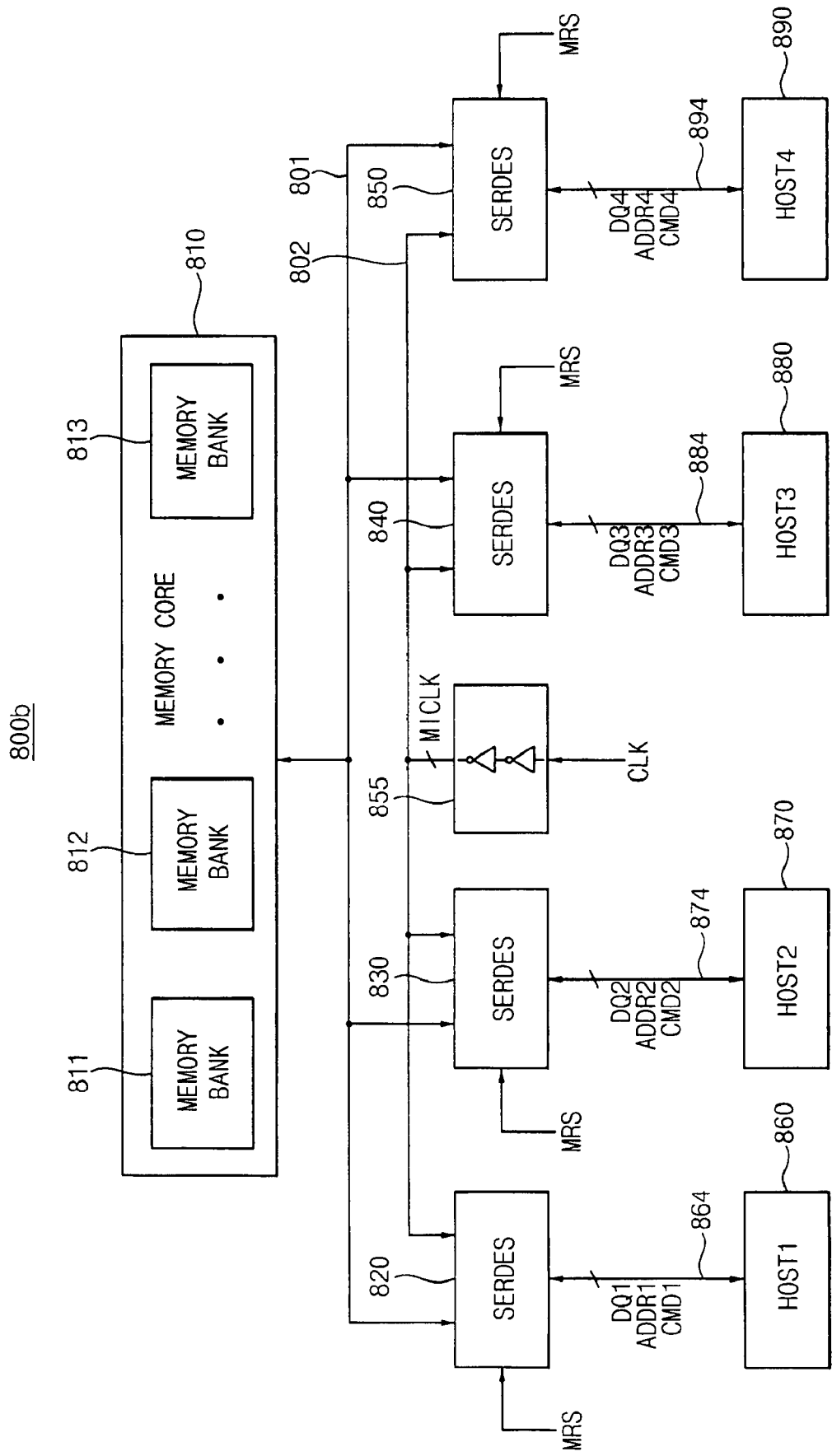
FIG. 22 is a block diagram illustrating a multi-port memory device according to another example embodiment of the present invention.

FIG. 22 is a block diagram illustrating a multi-port memory device 800b according to another example embodiment of the present invention.

In the example embodiment of FIG. 22, the multi-port memory device 800b may have a configuration similar to that of the multi-port memory device 800a shown in FIG. 21. However, the internal clock signal MICLK generated by the buffer 855 in FIG. 22 may have the capacity to conform to multiple phases (e.g., an adjustable phase), whereas the internal clock signal ICLK generated by the buffer 855 in FIG. 21 may include the same phase.

In the example embodiment of FIG. 22, the internal clock signal MICLK generated by the buffer 855 may correspond to two clock signals having opposite phases as illustrated in the example embodiment of FIG. 3A. In an alternative example, the internal clock signal MICLK generated by the buffer 855 may correspond to four clock signals having different phases as illustrated in the example embodiment of FIG. 3B.

In an example, the multi-port memory device 800b shown in FIG. 22 may operate similarly to that of the multi-port memory device 800 shown in FIG. 20, and thus a further description thereof has been omitted for the sake of brevity.

Example embodiments of the present invention being thus described, it will be obvious that the same may be varied in many ways. For example, while above-described example embodiments have been directed to a multi-port memory device including a plurality of ports, other example embodiments of the present invention may be directed to any multi-port device, such as a semiconductor device (e.g., a non-memory semiconductor device).

In another example embodiment of the present invention, a multi-port semiconductor device may selectively generate clock signals having frequencies and/or phases which may be configured for operation with an associated host, such that the generated clock signals may be adjusted as necessary and a number of port pins need not be increased to accommodate different clock signal requirements. Further, the multi-port memory device according example embodiments of the present invention may be suitable for lower power applications.

Such variations are not to be regarded as a departure from the spirit and scope of example embodiments of the present invention, and all such modifications as would be obvious to one skilled in the art are intended to be included within the scope of the following claims.

What is claimed is:

1. A multi-port semiconductor device, comprising:
a clock generating unit receiving an external clock signal having a given frequency and a given phase, the clock generating unit generating a plurality of local clock signals by adjusting at least one of the given frequency and given phase of the received external clock signal such that at least one of the plurality of local clock signals have at least one of a different frequency and a different phase as compared to the given frequency and given phase, respectively, of the received external clock signal, wherein the clock generating unit includes a plurality of ports configured to synchronize input signals and output signals with respect to each of the plurality of ports based on the plurality of local clock signals.

2. The multi-port semiconductor device of claim 1, wherein the clock generating unit further includes a clock generator configured to generate an internal clock signal based on the received external clock signal and a plurality of local clock generators configured to generate the plurality of local clock signals based on the internal clock signal.

3. The multi-port semiconductor device of claim 2, wherein a frequency of each of the plurality of local clock signals is configured to be set based on a mode register set (MRS) signal.

4. The multi-port semiconductor device of claim 2, wherein each of the plurality of ports is configured to receive and transmit an address signal, a command signal and data to and from respective hosts in a parallel transmission mode.

5. The multi-port semiconductor device of claim 2, wherein each of the plurality of ports is configured to receive and transmit an address signal, a command signal and data to and from respective hosts in a serial transmission mode.

6. The multi-port semiconductor device of claim 2, wherein the internal clock signal includes a plurality of phases.

7. The multi-port semiconductor device of claim 2, wherein the internal clock signal includes a plurality of internal clock signals having different frequencies.

8. The multi-port semiconductor device of claim 7, wherein a frequency of each of the internal clock signals is configured to be set based on a mode register set (MRS) signal.

9. The multi-port semiconductor device of claim 7, wherein each of the plurality of internal clock signals is configured to have multiple phases.

10. The multi-port semiconductor device of claim 1, wherein the clock generating unit further includes a clock generator configured to generate a plurality of internal clock signals having different frequencies from each other based on the received external clock signal.

11. The multi-port semiconductor device of claim 10, wherein the plurality of internal clock signals correspond to the plurality of local clock signals.

12. The multi-port semiconductor device of claim 10, wherein a frequency of each of the plurality of internal clock signals is configured to be set based on a mode register set (MRS) signal.

13. The multi-port semiconductor device of claim 10, wherein each of the plurality of ports is configured to receive and transmit an address signal, a command signal and data to and from respective hosts in a parallel transmission mode.

14. The multi-port semiconductor device of claim 10, wherein each of the plurality of ports is configured to receive and transmit an address signal, a command signal and data to and from respective hosts in a serial transmission mode.

15. The multi-port semiconductor device of claim 10, wherein each of the plurality of internal clock signals is configured to have multiple phases.

16. The multi-port semiconductor device of claim 1, wherein the clock generating unit further includes a clock generator configured to generate an internal clock signal based on the received external clock signal, and
wherein the plurality of ports correspond to a plurality of Serializer/Deserializers (SERDESs), each of the plurality of SERDESs generating one of the plurality of local clock signals based on the internal clock signal.

17. The multi-port semiconductor device of claim 16, wherein a frequency of each local clock signal is configured to be set based on a mode register set (MRS) signal.

18. The multi-port semiconductor device of claim 16, wherein each of the plurality of SERDESs is configured to receive and transmit an address signal, a command signal and data to and from respective hosts in a parallel transmission mode.

19. The multi-port semiconductor device of claim 16, wherein each of the plurality of SERDESs is configured to receive and transmit an address signal, a command signal and data to and from respective hosts in a serial transmission mode.

20. The multi-port semiconductor device of claim 16, wherein the internal clock signal is configured to have multiple phases.

21. The multi-port semiconductor device of claim 16, wherein the internal clock signal includes a plurality of internal clock signals having different frequencies from each other.

22. The multi-port semiconductor device of claim 21, wherein a frequency of each of the plurality of internal clock signals is configured to be set based on a mode register set (MRS) signal.

23. The multi-port semiconductor device of claim 21, wherein each of the plurality of internal clock signals is configured to have multiple phases.

24. The multi-port semiconductor device of claim 21, wherein each of the plurality of SERDESs is configured to receive one of the plurality of internal clock signals and to adjust a frequency of the received internal clock signal to generate one of the plurality of local clock signals.

25. The multi-port semiconductor device of claim 1, wherein the clock generating unit includes a buffer configured to buffer the received external clock signal to generate an internal clock signal, and
wherein the plurality of ports correspond to a plurality of Serializer/Deserializers (SERDESs), each of the plurality of SERDESs generating one of the plurality of local clock signals based on the internal clock signal.

26. The multi-port semiconductor device of claim 25, wherein a frequency of the generated local clock signal is configured to be set based on a mode register set (MRS) signal.

27. The multi-port semiconductor device of claim 25, wherein each of the plurality of SERDESs is configured to receive and transmit an address signal, a command signal and data to and from respective hosts in a parallel transmission mode.

28. The multi-port semiconductor device of claim 25, wherein each of the plurality of SERDESs is configured to receive and transmit an address signal, a command signal and data to and from respective hosts in a serial transmission mode.

29. The multi-port semiconductor device of claim 25, wherein the internal clock signal is configured to have multiple phases.

30. The multi-port memory device of claim 1, further comprising:
a memory core,
wherein the clock generating unit further includes a clock generator configured to generate an internal clock signal based on received external clock signal and a plurality of local clock generators configured to generate the plurality of local clock signals based on the internal clock signal, and
wherein the plurality of ports are configured to synchronize the input signals based on the plurality of local clock signals to provide the synchronized input signals to the memory core, and are configured to synchronize the output signals provided from the memory core to output to an external device.

31. The multi-port memory device of claim 30, wherein the internal clock signal includes a plurality of internal clock signals having different frequencies from each other.

32. A method of operating a multi-port memory device, comprising:
receiving an external clock signal having a given frequency and a given phase;
generating a plurality of local clock signals by adjusting at least one of the given frequency and given phase of the received external clock signal, at least one of the plurality of local clock signals having at least one of a different frequency and a different phase as compared to the given frequency and given phase, respectively, of the received external clock signal; and synchronizing input signals and output signals with respect to each of a plurality of ports based on the plurality of local clock signals.

33. The method of claim 32, wherein the frequency and phase of each of the plurality of local clock signals corresponds to operating requirements of a corresponding host device.

34. The method of claim 32, further comprising:
generating an internal clock signal based on the received external clock signal,
wherein the plurality of local clock signals are based on the internal clock signal.

35. The method of claim 32, wherein the generating step generates the plurality of local clock signals by buffering the received external clock signal.

36. The method of claim 32, further comprising:
generating a plurality of internal clock signals having different frequencies from each other based on the received external clock signal.

37. The method of claim 36, wherein the plurality of internal clock signals corresponds to the plurality of local clock signals.

* * * * *